(12) United States Patent
Duley

(10) Patent No.: US 7,005,586 B1
(45) Date of Patent: Feb. 28, 2006

(54) SUPPLYING POWER/GROUND TO A COMPONENT HAVING SIDE POWER/GROUND PADS

(75) Inventor: Raymond S. Duley, Buda, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 6 days.

(21) Appl. No.: 10/741,351

(22) Filed: Dec. 19, 2003

Related U.S. Application Data

(63) Continuation-in-part of application No. 10/688,817, filed on Oct. 17, 2003.

(51) Int. Cl.
*H01R 12/04* (2006.01)

(52) U.S. Cl. .................. 174/261; 174/260; 174/59; 361/803; 361/808; 439/65

(58) Field of Classification Search .............. 174/260, 174/52.1, 59, 60; 361/761–764, 784, 803, 361/808, 809, 785–791; 438/65–75
See application file for complete search history.

(56) References Cited

U.S. PATENT DOCUMENTS

| | | | |
|---|---|---|---|
| 4,616,655 A * | 10/1986 | Weinberg et al. | .............. 607/2 |
| 5,136,471 A | 8/1992 | Inasaka | |
| 5,239,198 A * | 8/1993 | Lin et al. | ................. 257/693 |
| 5,313,096 A * | 5/1994 | Eide | ............... 257/686 |
| 5,315,069 A | 5/1994 | Gebara | |
| 5,574,630 A | 11/1996 | Kresge et al. | |
| 5,894,411 A | 4/1999 | Embo et al. | |
| 6,239,485 B1 | 5/2001 | Peters et al. | |
| 6,304,450 B1 | 10/2001 | DiBene, II et al. | |
| 6,326,647 B1 * | 12/2001 | Chiu | ............ 257/99 |
| 6,356,448 B1 | 3/2002 | DiBene, II et al. | |
| 6,452,113 B1 | 9/2002 | DiBene, II et al. | |
| 6,452,804 B1 | 9/2002 | DiBene, II et al. | |
| 6,490,160 B1 | 12/2002 | DiBene, II et al. | |
| 6,501,103 B1 * | 12/2002 | Jory et al. | ............. 257/100 |
| 6,556,455 B1 | 4/2003 | DiBene, II et al. | |
| 6,558,169 B1 * | 5/2003 | Figueroa et al. | ............ 439/70 |
| 6,642,730 B1 * | 11/2003 | Hembree et al. | .......... 324/755 |
| 6,853,559 B1 * | 2/2005 | Panella et al. | ............ 361/764 |

(Continued)

FOREIGN PATENT DOCUMENTS

EP   1 256 263   11/2002

(Continued)

OTHER PUBLICATIONS

Jim Hjerpe, "Power Distribution for High-Performance Processors," HDI, The Magazine of High-Density Interconnect, vol. 3, No. 10, Oct. 2000, pp. 22-24.

(Continued)

*Primary Examiner*—Kamand Cuneo
*Assistant Examiner*—Jeremy Norris
(74) *Attorney, Agent, or Firm*—Lawrence J. Merkel; Meyertons, Hood, Kivlin, Kowert & Goetzel, P.C.

(57) ABSTRACT

In various embodiments, one or more connectors are configured to make electrical contact with side power and ground pads on a component. The connectors may include, in some embodiments, a conductive member and a compressible conductor for making electrical contact with the side pads. In some embodiments, the connectors are attached to a power board configured to be placed over a top of the component during use. In other embodiments, the connectors are attached to a socket into which the component is inserted during use. In still other embodiments, the connectors are attached to a motherboard to which the socket is attached.

28 Claims, 18 Drawing Sheets

U.S. PATENT DOCUMENTS

| | | |
|---|---|---|
| 2002/0172022 A1 | 11/2002 | DiBene, II et al. |
| 2003/0002268 A1 | 1/2003 | DiBene, II et al. |
| 2003/0057548 A1 | 3/2003 | Hartke et al. |

FOREIGN PATENT DOCUMENTS

| | | |
|---|---|---|
| EP | 1 261 999 | 12/2002 |
| WO | 01/06821 A1 | 1/2001 |
| WO | 01/33927 A1 | 5/2001 |
| WO | 01/65344 A2 | 9/2001 |
| WO | 02/089260 A2 | 11/2002 |
| WO | 02/089260 A3 | 11/2002 |

OTHER PUBLICATIONS

INCEP Technologies, Inc., "High-Current Processor Power Delivery Systems," 2003, 4 pages.

INCEP Technologies, Inc., "INVEP ZVRM™ Architecture," 2003, 5 pages.

Prismark Partners LLC, "Power Demands in High-End Microprocessors," Feb. 2002, 14 pages.

* cited by examiner

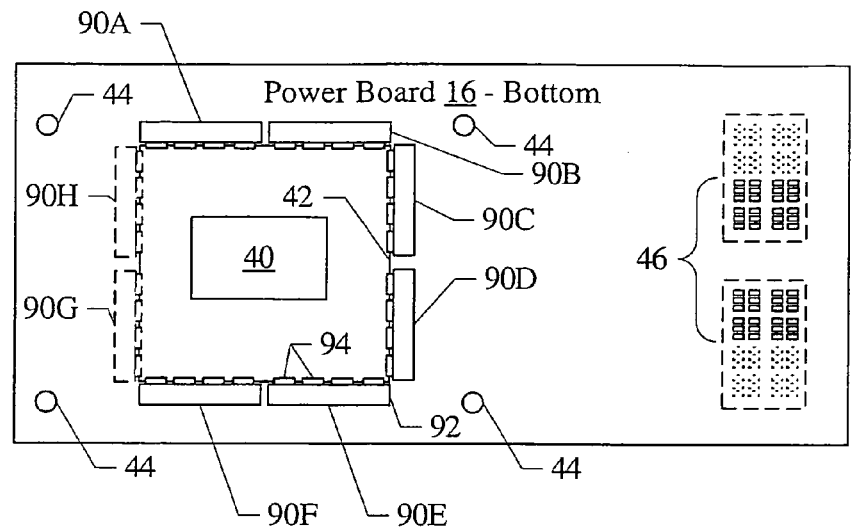
Fig. 12
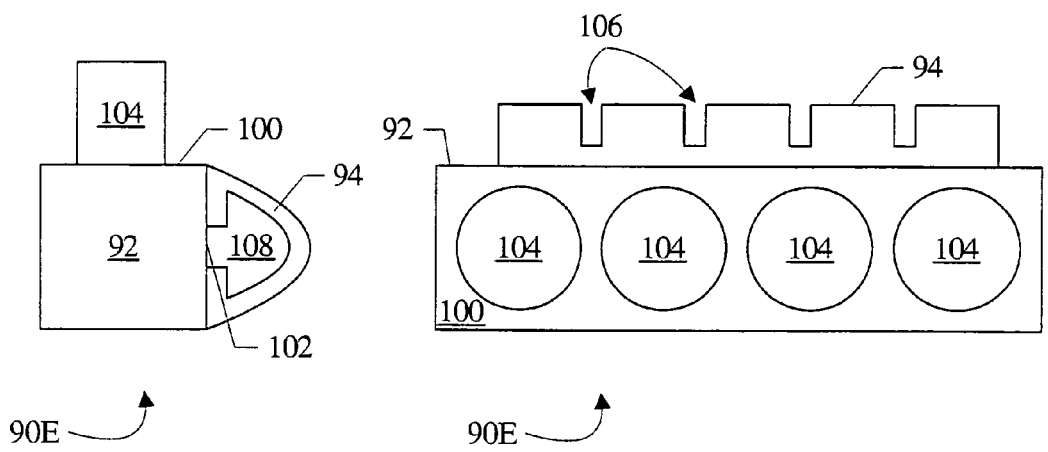
Fig. 13
Fig. 14

SUPPLYING POWER/GROUND TO A COMPONENT HAVING SIDE POWER/GROUND PADS

This application is a continuation-in-part of U.S. patent application Ser. No. 10/688,817, filed on Oct. 17, 2003.

BACKGROUND OF THE INVENTION

1. Field of the Invention

This invention is related to integrated circuit components and, more particularly, to supplying integrated circuit components with power.

2. Description of the Related Art

Over time, the magnitude of the supply voltage for various integrated circuits has been reduced. Where 5 volts and even higher was once a common voltage magnitude, more recent integrated circuits have specified supply voltage magnitudes in the range of 1.5 volts. In the future, the magnitude of the voltage is expected to decrease even further.

At the same time, the number of transistors included in the integrated circuits has continued to increase, and the power requirements of the integrated circuits have continued to grow. For example, modern processor products often consume 50–100 watts of power. If a supply voltage of 1.5 volts is presumed, the current required to supply 50–100 watts of power is on the order of 30–60 amps. Future processor generations are expected to grow the power consumption as well, requiring in excess of 100 amps of current at the expected supply voltage magnitudes.

High currents such as those now being experienced and those expected in the future are problematic. First, the integrated circuits are typically packaged in a device having pins for connecting the integrated circuits to a circuit board such as the mother board of a computer. The pins are relatively small in cross section, and thus the current that the pin can sink or source without damage is limited. In many current integrated circuits, as much as 2/3 of the package pins are dedicated to power and ground connections. To support high currents, even more of the package pins would have to be dedicated to power and ground connections, limiting the number of pins available for signal connections. Second, managing such high currents on the mother board is problematic, especially for the less expensive motherboard designs typically used in, for example, personal computers.

One attempt to address the high current issues is implemented in the Itanium 2 processor product manufactured by Intel Corp. (Santa Clara, Calif.). The Itanium 2 processor product includes an integrated circuit implementing the processor, attached to a printed circuit board. The printed circuit board also includes voltage regulation circuitry that receives a relatively high voltage input to the board (e.g. 12 volts), and reduces the voltage magnitude to the supply voltage used by the processor (e.g. 1.5 volts). The input to the board may be from a power pod module coupled to the board with a flexible connector. Power pod modules may be available from, e.g., Tyco Electronics, Inc., Celestica Power Systems, or Delta Electronics, Inc. The higher voltage input to the board may permit the current input to the board to be lower than the current input to the processor (since power is the product of voltage and current). However, this solution may be costly, since components to perform voltage regulation/power conversion with a physical size that is appropriate for the board may be expensive. Additionally, the processor manufacturer must become involved in board manufacturing, voltage regulator component stocking, managing lead time for the components of the voltage regulator, etc.

Another attempt to address the high current issues, implemented by Incep Technologies, Inc. (San Diego, Calif.), includes the voltage regulation module above the integrated circuit, between the heat sink and the integrated circuit. This approach also may be costly, as the components used to form the voltage regulation module must be small so as to fit between the heat sink and the integrated circuit. Furthermore, the current limits of such small components may limit the applicability of this solution in future products.

SUMMARY OF THE INVENTION

In one embodiment, an apparatus is contemplated for use with a component that includes one or more integrated circuits and a component package to which the one or more integrated circuits are coupled. The component package has a bottom comprising a plurality of conductors for providing signal connection to the one or more integrated circuits, a top to which the one or more integrated circuits are coupled, and a plurality of sides. At least one of the plurality of sides includes at least one power pad for providing a power supply voltage to the one or more integrated circuits and wherein at least one of the plurality of sides includes at least one ground pad for providing a ground to the one or more integrated circuits. The apparatus comprises a circuit board configured to be placed over a top of the component. The circuit board includes a bottom side that faces the component during use. Two or more connectors are connected to the bottom side of the circuit board, wherein the connectors are configured to make electrical contact with the power pad and ground pad on the plurality of sides of the component package when the circuit board is in place over the top of the component.

In another embodiment, the apparatus for use with the above mentioned component comprises a socket configured to be coupled to a first circuit board during use and two or more connectors mechanically attached to the socket. The socket is configured to couple a component that is inserted into the socket, during use, to the first circuit board during use. The connectors are configured to make electrical contact with the power pad and ground pad on the plurality of sides of the component package when the component is in the socket, where the two or more connectors are configured to be electrically coupled to a second circuit board placed over a top of the component during use. In yet another embodiment, a socket including indentations for mechanical attachment to the connectors is contemplated.

In still another embodiment, an apparatus for use with the above mentioned component comprises a first circuit board, a socket configured to be coupled to the first circuit board, and two or more connectors mechanically attached to the first circuit board. The socket is configured to couple a component that is inserted into the socket, during use, to the first circuit board during use. The connectors are configured to make electrical contact with the power pad and ground pad on the plurality of sides of the component package when the component is in the socket, where the two or more connectors are configured to be electrically coupled to a second circuit board placed over a top of the component during use.

In another embodiment, a connector for use with the above mentioned component comprises a conductive member having a first surface and one or more compressible conductors affixed to the first surface. The compressible conductors, during use, make electrical contact with the power pad and ground pad on the plurality of sides of the component package.

BRIEF DESCRIPTION OF THE DRAWINGS

The following detailed description makes reference to the accompanying drawings, which are now briefly described.

FIG. 12 is a bottom view of another embodiment of a power board.

FIG. 13 is an end view of one embodiment of a connector shown in FIG. 12.

FIG. 14 is a top view of one embodiment of the connector shown in FIG. 12.

Figure 1:
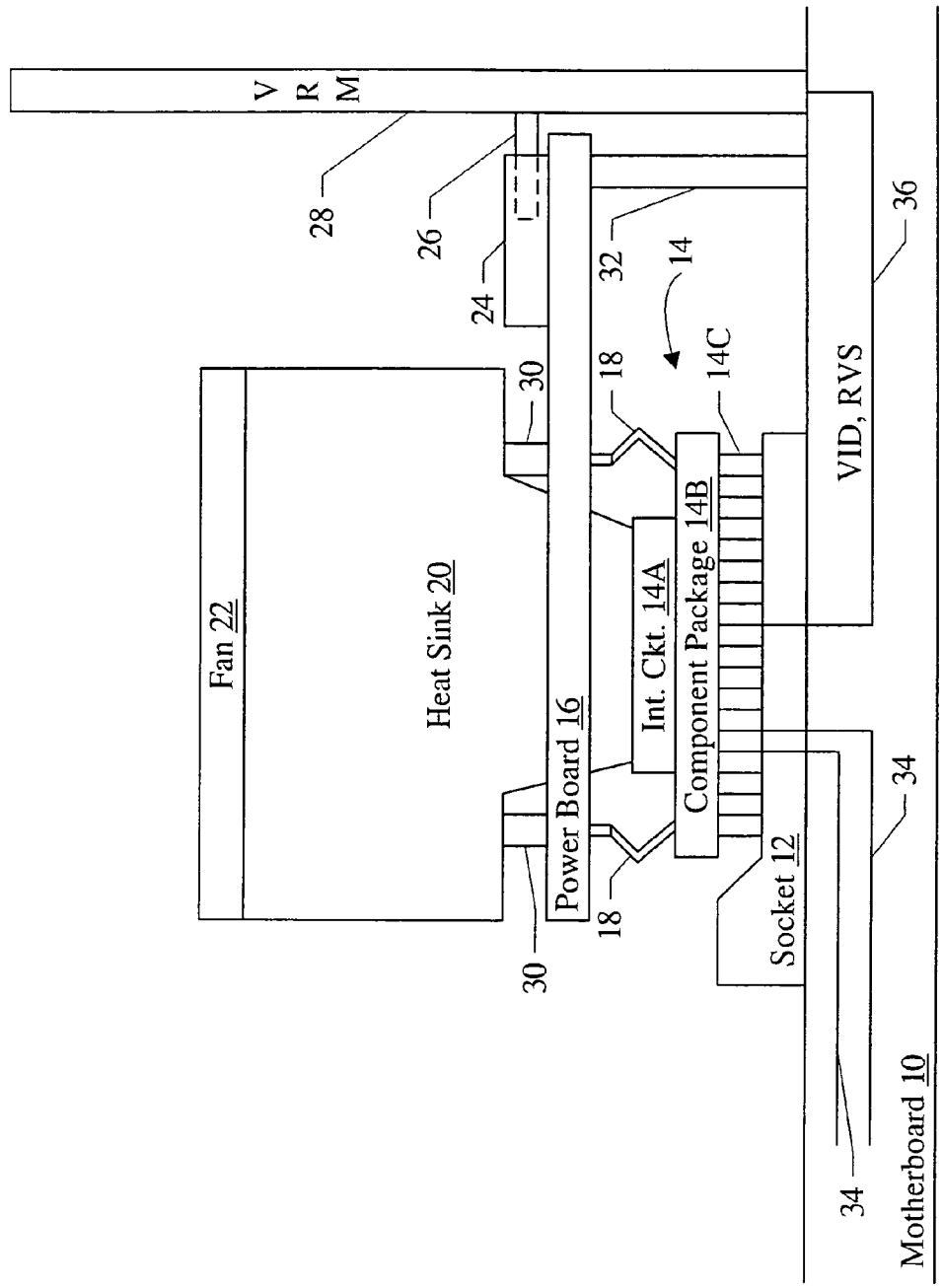
FIG. 1 is a block diagram of a portion of one embodiment of an electronic system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram illustrating a portion of one embodiment of an electronic system is shown. In the illustrated embodiment, the electronic system may include a first circuit board (labeled motherboard) 10, a socket 12, a component 14 (comprising one or more integrated circuits such as integrated circuit 14A and a component package 14B in the illustrated embodiment), a power board 16, spring connectors 18, a heat sink 20, a fan 22, a connector 24 on the power board 16, a corresponding connector 26 on a voltage regulation module (VRM) 28, and standoffs 30 and 32.

In some embodiments, the electronic system may be a computer system such as a personal computer (PC) or a server computer system. A computer system will be used at various points herein as an example, and a processor may be used as an example of the component 14. However, any electronic system that employs circuit boards and components attached thereto may be used in other examples and embodiments. As used herein, a circuit board may include any structure of alternating layers of conductors and insulating material used to couple various components and other electrical devices together. The insulating material layers may include vias to connect conductors in adjoining layers above and below the insulating material layers. For example, a printed circuit board may be an exemplary circuit board. In the illustrated embodiment, each of the motherboard 10 and the power board 16 may be examples of circuit boards. A component may comprise any combination of one or more integrated circuits and a package used to provide electrical interface between the integrated circuit(s) and other components, circuit boards, etc. For simplicity herein, a component may at some points be discussed as including one integrated circuit. However, in general, more than one integrated circuit may be included in the component.

The component packet 14B may include a plurality of pins 14C that are used to connect the component 14 to a circuit board such as the motherboard 10 (e.g. through the socket 12, in the illustrated embodiment). Generally, the pins 14C may comprise any conductors for providing electrical connectivity between the component 14 and a circuit board. The pins 14C may be any of a variety of constructions, such as pin grid arrays (PGAs), ball grid arrays (BGAs), etc. The pins 14C may be used to provide signal connection to the component 14 (that is, communicative signals such as input, output, and input/output signals as opposed to power and ground connections). Thus, signal connection may be provided through the bottom side of the component 14 (the side nearest the motherboard 10). For example, various conductors 34 in the motherboard 10 may be electrically coupled to various pins 14C for communication with other components/devices. The package 14B may further comprise any electrical interconnection between the pins 14C and the integrated circuit 14A. For example, in some embodiments, the packet 14B may comprise a circuit board providing the electrical interconnection and also including power and ground planes for supplying power supply voltage and ground to the integrated circuit 14A. In some embodiments, the package 14B may comprise an organic package, and in some other embodiments the package 14B may comprise a ceramic package. In other embodiments, the package 14B may comprise discrete conductors between each pin and the integrated circuit 14A.

On the other hand, power and ground connection may be made through the power board 16 to the top side of the component 14 (that is, the side of the component 14 opposite the side of the component 14 that faces the motherboard 10), in the illustrated embodiment. More particularly, the power and ground connection may be made through the power board 16 to the top side of the component package 14B, in the illustrated embodiment.

The power board 16 may be positioned above the component 14 (e.g., between the component 14 and the heat sink 20, as shown in FIG. 1) and may be coupled to the VRM 28 through the connectors 24 and 26. The VRM 28 may supply the voltage magnitude and current requirements of the component 14 to the power board 16, which may convey the voltage/current to the top of the component 14 (e.g. through the spring connectors 18 in the illustrated embodiment).

By supplying power and ground connection to the top of the component 14, the pins 14C may be dedicated to providing signal interconnection, in some embodiments. The pins 14C may not be required to source or sink large currents associated with the power and ground connections, in some embodiments, but rather the typically smaller signal currents.

In some embodiments, the component 14 may output one or more signals identifying the voltage magnitude required by the component 14. These voltage identification (VID) signals may be routed through pins 14C, the motherboard 10 (e.g. conductors 36 in FIG. 1), to the VRM 28. In one embodiment in which the component 14 is a processor, for example, there may be 5 VID signals. The VRM 28 may generate the voltage of the desired magnitude for transmission through the power board 16 to the component 14. In some embodiments, the VRM 28 may also measure the voltage actually received by the component 14 using a pair of remote voltage sense (RVS) lines, and may use the measured voltage as feedback for generating the voltage by the VRM 28, to ensure that the voltage magnitude actually received by the component 14 (taking into account an $I^2R$ losses in the connectors 24 and 26, the power board 16, and the connectors 18) is the voltage indicated on the VID signals (or a close approximation thereof). The RVS lines may also be routed through the motherboard 10 from to the VRM 28. By routing signals communicating between the component 14 and the VRM 28 through the motherboard 10, only power and ground pads need be provided on the top of the component 14 (and on the power board 16) which may maximize the number of power and ground pads (and thus the amount of current that may be supplied to the component 14). Additionally, the power board 16 may be relatively simple, since it delivers power and ground to the component 14 and does not route signals between the component 14 and the VRM 28.

The power board 16 may extend horizontally beyond an edge of the component package 14B to make connection with the VRM 28. For example, in the orientation shown in FIG. 1, the power board 16 extends to the right beyond the right edge of the component package 14B to make contact with the VRM 28. In this fashion, the VRM 28 may be arranged to a side of the component 14 (other than the top or bottom side) and thus may be relatively independent of the component assembly. Standard VRMs 28 may be used, such as the VRMs available from Hewlett Packard (Palo Alto, Calif.), Delta Electronics, Inc. (Taiwan), etc. Furthermore, since the VRM 28 is separate from the component assembly, more freedom in the selection of circuitry on the VRM may be enjoyed. For example, inexpensive (often relatively large) devices may be selected to form the VRM 28. Additionally, components capable of high currents may be selectable without much regard to the size of the components.

Viewed in another way, there may be an area defined on the surface of the motherboard 10 (referred to as the "keep out" area) which at least matches the footprint of the heat sink on the motherboard 10. That is, if the keep out area were extended vertically, the resulting volume would encompass the heat sink. The VRM 28 may be arranged outside of the keep out area, and the power board 16 may extend out of the keep out area. In one embodiment, the connector 24 may be affixed to the power board 16 on the portion of the power board 16 that extends beyond the edge of the component 14 and/or out of the keep out area.

While the VRM 28 is shown to the right of the component 14 in the illustrated embodiment, the VRM 28 may be arranged to any side of the component 14 in various embodiments other than the top or bottom side.

The VRM 28 may be coupled to receive input power from the motherboard 10 in the form of a higher voltage magnitude and lower current magnitude than those required by the component 14. Thus, the motherboard 10 need not be designed to handle the relatively high currents that supply the component 14. In some embodiments, existing motherboard technologies may be used. For example, in PC systems, the motherboard 10 may typically comprise 4 layers for providing both power and ground and signal interconnect. Since high currents need not be supported in the motherboard 10, the existing technology may be used, in some embodiments. Furthermore, if current requirements change for future versions of the component 14, the motherboard 10 need not be changed. A new VRM 28 and/or power board 16 may be installed, if necessary.

In the illustrated embodiment, the spring connectors 18 may be used to make electrical connection between the component packet 14B and the power board 16. The spring connectors 18, when not compressed between the power board 16 and the component package 14B, may extend a distance that exceeds the distance between the power board 16 and the component packet 14B. The compression of the spring connectors 18 between the power board 16 and the component package 14B may provide a high quality electrical connection. In one embodiment, the spring connectors 18 may be affixed (e.g. soldered) to the power board 16 and may be compressed against the component package 14B. In another embodiment, the spring connectors 18 may be affixed to the component packet 14B and may be compressed against the power board 16. The power board 16 may comprise a plurality of conductive pads, and the component package 14B may comprise a corresponding plurality of conductive pads (shown in FIGS. 3 and 4, respectively). The spring connectors 18 may comprise a connector, for each of the conductive pads on the power boards 16, that extends between that conductive pad and the corresponding conductive pad on the component package 14B. In yet other embodiments, the power board 16 and the component 14 may be electrically coupled in other ways (e.g. solder connections may be made).

In the illustrated embodiment, the spring connectors 18 may have an "elbow" in the connector that can be compressed to make the connection. Other embodiments may include vertical springs, or any other compressible connector. In one implementation, the spring connectors 18 may be selected from various connectors available from Molex, Inc. (e.g. part number 49Z0000006).

For good thermal conduction from the integrated circuit 14A to the head sink 20, it is desirable for the heat sink 20 to physically contact the integrated circuit 14A (although a thermal adhesive or gel may be used). Thus, the power board 16 may have an opening formed therein to permit passage of a protrusion on the heat sink through the opening to make contact with the integrated circuit 14A.

As mentioned above, in the illustrated embodiment, the spring connectors 18 may be compressed to make electrical connection between the power board 16 and the component 14. The weight of the heat sink 20 may be used to supply some of the compression force. To concentrate the force, standoffs 20 may be applied to the power board 30. The heat sink 20, when in place, may rest on the standoffs 30. The standoffs 30 may be arranged vertically above the spring connectors 18, so that the weight of the heat sink 20 may apply compressive force to the spring connectors 18. The exact position of the standoffs 30 relative to the spring connectors 18 may vary due to manufacturing variations in placement of the standoffs 30. Additionally, the standoffs 30 may be wider, in some embodiments, than the spring connectors 18. However, the nominal placement of the standoffs 30 may be such that at least a portion of the standoffs 30 are vertically aligned to the spring connectors 18. The standoffs 30 may be formed of any substantially resilient materials. For example, in one embodiment, the standoffs 30 may contain rubber. The standoffs 30 may be formed from bulk rubber, or may comprise a rubber-based epoxy or other caulk-like material that may be applied to the power board 16. A standoff 32 may also be used to provide support for the power board 16, as shown in FIG. 1. In other embodiments, the standoff 32 may be eliminated.

The connectors 24 and 26 may be any suitable connector that may support the current requirements of the component 14. For example, in one implementation, the connectors 24 and 26 may be the 2 millimeter quad row shoulder connectors available from Samtec, Inc. (New Albany, Ind.) in the TMMS series (e.g. part number TMMS12-01-T-Q). While the connectors 24 and 26 make a horizontal connection in the illustrated embodiment, in other embodiments the connectors 24 and 26 may make a vertical connection (i.e. one of the connectors 24 or 26 may be substantially above the other when connected). The connector 24 may be attached to either the top side of the power board 16 (as shown in FIG. 1) or the bottom side, in various embodiments. In still other embodiments, the VRM 28 may be integrated onto the power board 16 (on the portion that extends beyond the edge of the component 14 or that is outside of the keep out area of the heat sink 20). In such an embodiment, the power board 16/VRM 28 combination may include a connector to the motherboard 10 to supply power to the VRM 28. One or more connectors 24 (and corresponding connectors 26) may be used in various embodiments.

The socket 12 is coupled to the motherboard 10. For example, the socket 12 may be soldered to the motherboard 10, or otherwise affixed to the motherboard 10 in an essentially permanent fashion. The socket 12 may be provided to permit coupling of the component 14 to the motherboard 10 in a fashion that permits relatively easy insertion and removable. For example, the socket 12 may be a zero insertion force (ZIF) socket of any of a variety of designs. Alternatively, the socket 12 may employ constant frictional force to hold a component 14 in place, in which case the component 14 may be pushed into the socket 12 with enough force to cause the component 14 to slide into the socket. In yet other embodiments, the socket 12 may be eliminated and the component 14 may be affixed to the motherboard (e.g. soldered or otherwise affixed in an essentially permanent fashion).

It is noted that, while the VRM 28 is shown in a vertical arrangement in FIG. 1, the VRM 28 may be horizontal in other embodiments, as desired. It is further noted that FIG. 1 is not intended to be viewed as "to scale". The relative sizes of various elements in FIG. 1 have been skewed to provide clarity and simplicity in the drawings. Similarly, the remaining figures should not be viewed as "to scale" either.

A voltage regulation module (VRM) 28 is shown in the embodiment of FIG. 1. However, generally any power supply module may be used in place of the VRM 28. A power supply module may comprise any device coupled to receive input power (a source voltage and current) and configured to output power at a desired voltage magnitude.

It is noted that the terms "bottom" and "top" have been used with regard to the component 14. These terms may be used in a relative sense with regard to the illustration in FIG. 1. Particularly, "bottom" and "top" may be relative to the motherboard 10. For example, the bottom of the component 14 may be the side that is nearest the motherboard 10 (or that faces the motherboard 10) or other circuit board that provides signal communication to the component 14. The top of the component 14 may be the opposite side of the component 14 than the bottom side. The motherboard 10 itself may, when installed in a housing such as a computer case, be oriented horizontally, vertically, with the component 14 upside down, etc., in various embodiments. The bottom and top of the power board 16 may have a similar interpretation.

It is noted that, in some embodiments of the power board 16 having more than one connector 24, the connectors may be arranged on various sides of the component 14, outside of the heat sink keep out area. Any connectors that are not on the same side of the component 14 as the VRM 28 may be coupled to the VRM 28 with an electrical conductor (e.g. a ribbon cable capable of carrying the current that is to pass through the connector).

Figure 2:
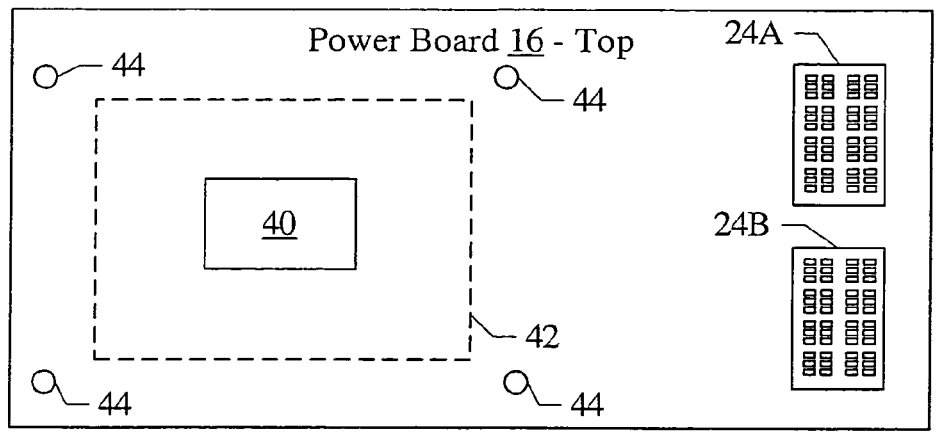
FIG. 2 is a top view of one embodiment of a power board shown in FIG. 1.
Figure 3:
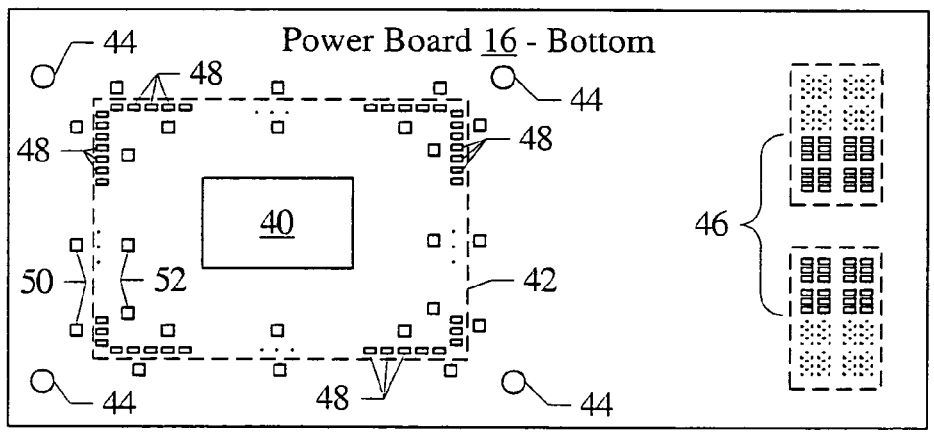
FIG. 3 is a bottom view of one embodiment of a power board shown in FIG. 1.

Turning next to FIGS. 2 and 3, top and bottom views of one embodiment of the power board 16 are shown. FIG. 2 is the top view, and FIG. 3 is the bottom view.

A pair of connectors 24A–24B are shown attached to the top of the power board 16. In the illustrated embodiment, each connector 24A–24B may comprise four rows of 12 pins. Half of the pins may carry power supply voltage (referred to as $V_{Core}$ herein), and the other half of the pins may carry ground (or $V_{SS}$). For example, in one implementation, the outside half of the pins (e.g. the 6 pins in each row that are nearest the outside edges of the power board 16)

may carry $V_{Core}$, and the remaining interior pins may carry ground. The top side of the power board 16 may carry one of the voltages, and the bottom side may carry the other. Either voltage may be carried on either side, in various embodiments. For the remainder of this embodiment, $V_{Core}$ will be presumed to be carried on the top side of the power board 16 and ground on the bottom side of the power board 16. Thus, the pins of the connectors 24A–24B the carry $V_{Core}$ may be connected to top side of the power board 16 and the remaining pins may pass through the power board 16 to connect to the bottom side of the power board 16.

Additionally, the opening 40 to permit passage of the protrusion of the heat sink 20 is shown in FIG. 2. A dotted box 42 illustrates the outline of the component 14 when the power board 16 is in place above the component 14. The dotted box 42 is shown merely for illustrative purposes, and does not represent any physical structure on the power board 16. Additionally, in some embodiments, a set of holes 44 may be provided to permit passage of bolts or other fasteners that may be inserted through the heat sink 20 and pass through the motherboard 10 to attach the heat sink 20 to the motherboard 10.

As FIG. 2 illustrates for this embodiment, the top side of the power board 16 does not include any circuitry in the area that the heat sink 20 will cover (since the connectors 24A–24B are arranged outside the area covered by the heat sink 20). Thus, the power board 16 may be relatively resistant to damage when the heat sink 20 is installed.

FIG. 3 includes solder connections 46 for the pins of the connectors 24A–24B that supply the ground voltage (i.e. the interior pins, in the illustrated embodiment). Other pins and the connectors 24A–24B themselves, being on the top side of the power board 16, are shown in dotted form for reference. The dotted box 42 is also shown in FIG. 3 for reference.

A plurality of conductive pads 48 are arranged inside the dotted box 42, to be aligned to corresponding pads on the component 14 during use. In the illustrated embodiment, the conductive pads 48 are arranged around the entire perimeter of the dotted box 42. In other embodiments, additional conductive pads 48 may be provided at various points around the interior of the dotted box 42, as desired. For example, in one particular embodiment, 17 pads may be provided along each edge of the component 14. The conductive pads may be of any desired conductive material. For example, copper or a copper/beryllium alloy is commonly used in conductive pads. The plurality of conductive pads 48 (and the corresponding conductive pads on the component 14) may have any size, spacing, pitch, etc. as desired and to conform to any requirements of the connector to be used between the two. For example, a pitch of 1–2 millimeters (mm) may be typical currently (e.g. 1.27 mm or 1 mm, or even less than 1 mm).

One half of the conductive pads 48 may be used to make $V_{Core}$ connections to the component 14 (power pads), and the other half of the conductive pads 48 may be used to make ground connections (ground pads). In one embodiment, adjacent conductive pads 48 along one edge may alternate between power pads and ground pads. That is, a first conductive pad may be assigned to be a power pad, the next adjacent conductive pad may be a ground pad, the next adjacent conductive pad to the ground pad may be another power pad, etc. Conductive pads may be more succinctly referred to herein as "pads".

Those pads 48 that supply the $V_{Core}$ voltage may be connected, through vias in the power board 16 (not shown), to the top of the power board 16, and may be insulated from the bottom of the power board 16. Pads 48 that supply the ground may be connected to the bottom of the power board 16.

In some embodiments, bypass capacitors and/or terminating resistors may be provided on the bottom side of the power board 16 (e.g. reference numerals 50 and 52). For example, 1 microfarad bypass capacitors 50 may be arranged around the outside of the dotted box 42 and 10 microfarad bypass capacitors 52 may be arranged around the inside of the conductive pads 48.

Figure 4:
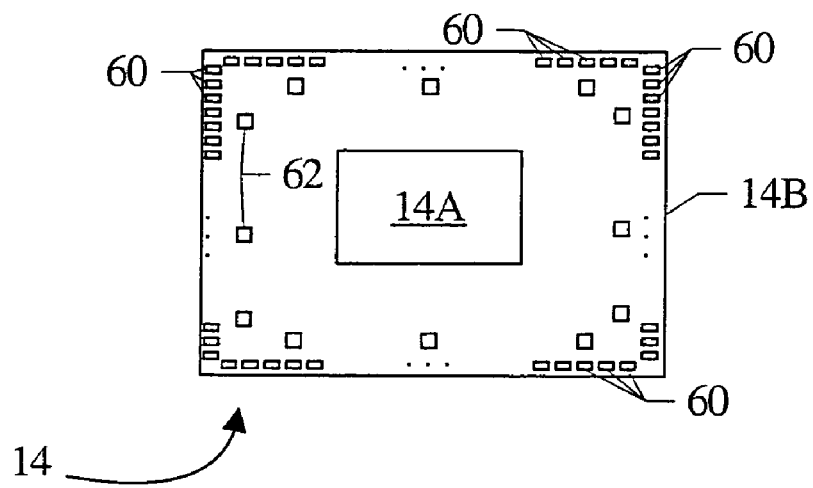
FIG. 4 is a top view of one embodiment of a component shown in FIG. 1.

FIG. 4 is a top view of one embodiment of the component 14. The integrated circuit 14A is shown atop the component package 14B. Arrayed around the periphery of the top of the component package 14B are conductive pads 60. The conductive pads 60 are placed on the component package 14B to align with the pads 48 on the circuit board 16 when the circuit board 16 is in place above the component 16. Manufacturing variations and skew between the circuit board 16 and the component 14 at insertion may prevent perfect alignment, but the pads 60 and 48 may nominally be designed to be aligned during use. Additionally, in some embodiments, the component 14 may include bypass capacitors 62 on the top of the component 14.

Figure 5:
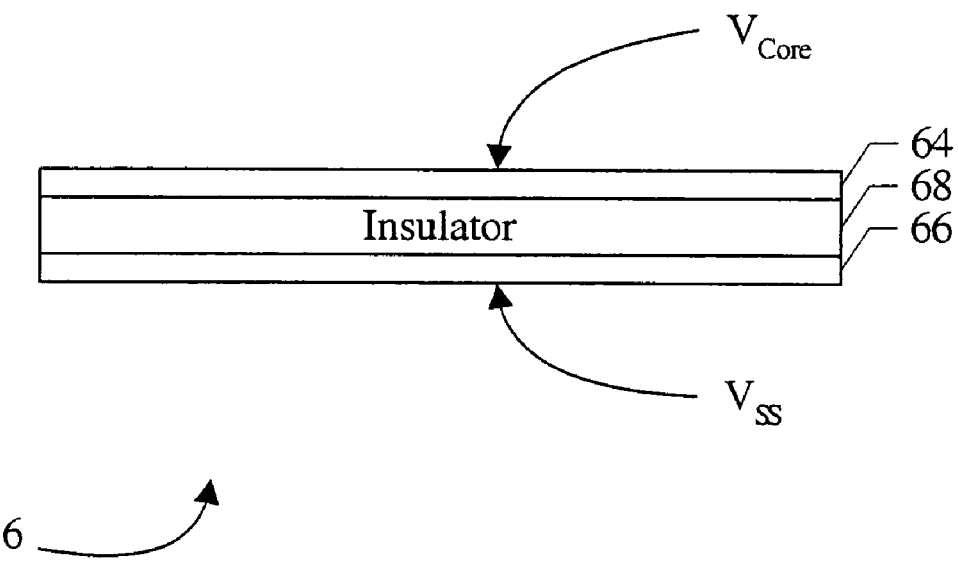
FIG. 5 is a side view of one embodiment of the power board shown in FIG. 1.

FIG. 5 is a side view of one embodiment of the power board 16. In the illustrated embodiment, a two layer board is used. The top layer may comprise a conductive plane 64 that carries the $V_{Core}$ voltage during use, and the bottom layer may comprise a conductive plane 66 the carries ground ($V_{SS}$) during use. An insulating material 68 separates the two planes. The conductive planes 64 and 66 may comprise any conductive material. For example, 2 ounce copper may form the conductive planes 64 and 66. Other embodiments may use other amounts of copper (e.g. 1 ounce, 4 ounce, etc.). The insulator material 68 may be any generally non-conductive material. For example, the insulator material 68 may comprise FR4 or prepreg material commonly used in printed circuit boards. In some embodiments, FR4 may be created from electrical alkali-free glass cloth that has been impregnated with an epoxy resin under pressure and heat.

While FIG. 5 illustrates a 2 layer power board 16, other embodiments may include additional layers. For example, in some embodiments, the current requirements of the component 14 may be high enough that the $I^2R$ voltage drop across the single voltage plane 64 may cause too much variation in the $V_{Core}$ voltage supplied at the pads 48 that are farthest from the connectors 24A–24B as compared to the $V_{Core}$ voltage supplied at the pads 48 that are nearest the connectors 24A–24B. In such cases, additional layers may be used (separated by insulating materials) and a plurality of voltage planes may be created on each layer to supply $V_{Core}$ voltage to various pads 48. The voltage planes may be designed to provide connectivity for each plane to an equal number of pins (for each plane) of the connectors 24A–24B that supply $V_{Core}$ voltage, and to approximate equalizing the $I^2R$ drop across each of the planes. Thus, planes to farther pads 48 (farther from the connectors 24A–24B) may be larger, in area, than planes to closer pads 48 (closer to the connectors 24A–24B).

Figure 6:
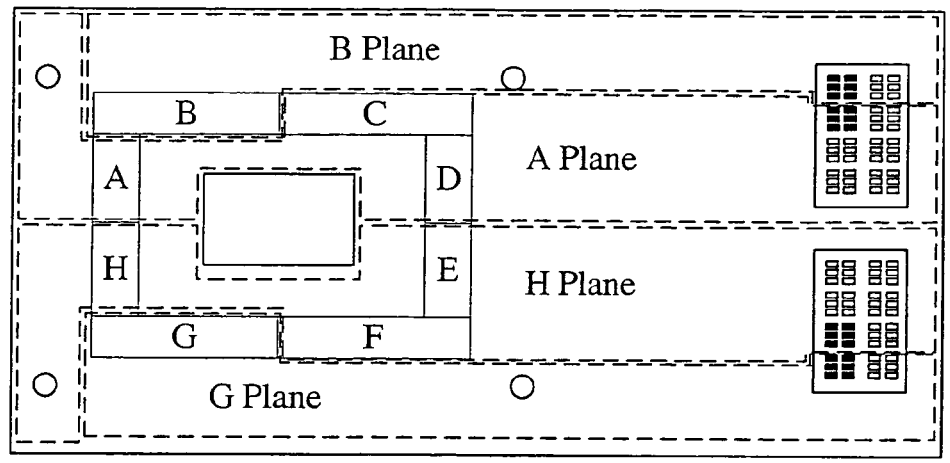
FIG. 6 is a block diagram of one embodiment of a first power supply layer of one embodiment of the power board shown in FIG. 1.
Figure 7:
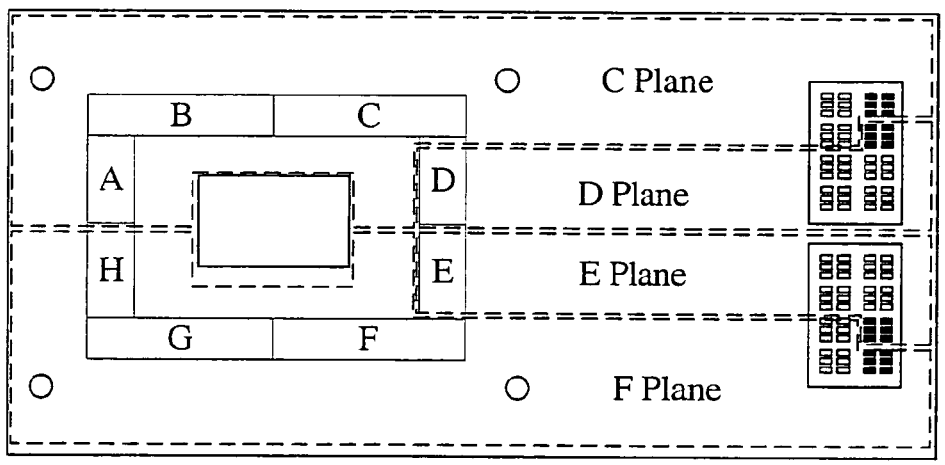
FIG. 7 is a block diagram of one embodiment of a second power supply layer of one embodiment of the power board shown in FIG. 1.

FIGS. 6 and 7 illustrate a set of power planes for a four layer embodiment (2 layers $V_{Core}$ and 2 layers ground). Power supply pins of the connectors 24A–24B that are coupled to each plane are filled in, as shown in FIGS. 6 and 7, for one embodiment. The pads are divided into eight zones, illustrated as rectangular boxes labeled A through H. FIG. 6 illustrates planes for zones A, B, G, and H (enclosed by dashed lines and labeled A plane, B Plane, G Plane, and H plane, respectively). Similarly, FIG. 7 illustrates planes for zones C, D, E, and F (enclosed by dashed lines and labeled C plane, D Plane, E Plane, and F plane, respectively). The ground planes may be arrange similarly, or may be solid, single planes per layer.

The above embodiment included a component 14 having power and ground pads on a top of the component package 14B. In such embodiments, vias within the component packet 14B couple the power and ground pads to power and ground planes within the package 14B (which supply power and ground to the integrated circuit 14A). These vias are typically smaller than vias in printed circuit boards, and are often referred to as "microvias". The microvias may themselves have current limits that may be exceeded by the current requirements of the integrated circuit 14A. To eliminate the microvias, another embodiment is contemplated in which power and ground pads are provided on the sides of the component package 14B. The pads may be inserted far enough into the sides of the component package 14B to directly contact the power and ground planes in the interior of the component package 14B. The pads may be made relatively large, and thus may have higher current capabilities than the microvias.

Figure 8:
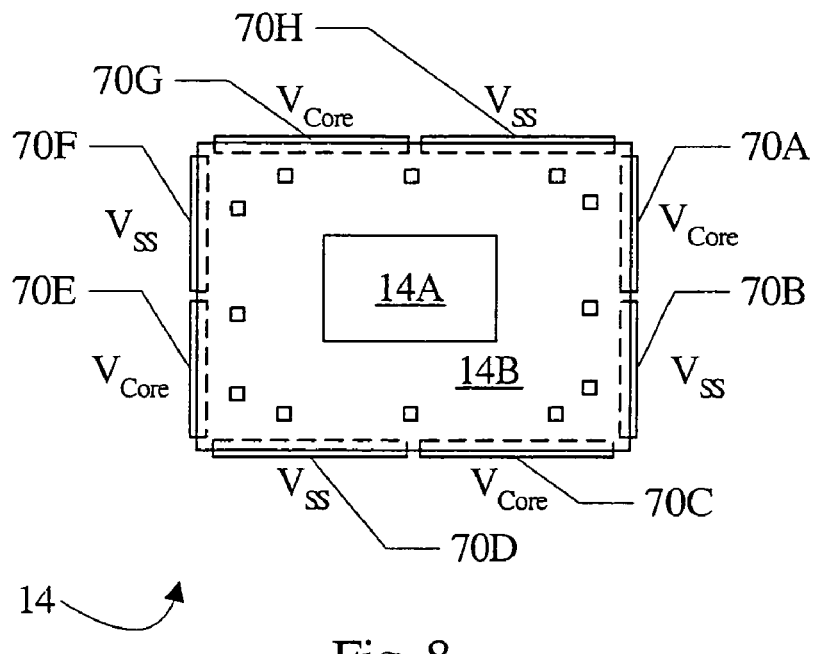
FIG. 8 is a top view of one embodiment of the component shown in FIG. 1 having side pads for power and ground instead of top pads.

FIG. 8 is a top view of one embodiment of the component 14 having power and ground pads 70A–70H on the sides of the component package 14B. Signal pins may still be provided on the bottom of the component 14, similar to the embodiment of FIGS. 1–7. Additionally, while one integrated circuit 14A is shown, other embodiments may include more than one integrated circuit in a component 14.

In the embodiment illustrated in FIG. 8, each side of the component 14 may include a pair of pads 70A–70H: one power ($V_{Core}$) and one ground ($V_{SS}$) pad. Other embodiments may include more than two pads on each side, if desired. Still other embodiments may include only one pad per side (either a power or ground pad). In yet another embodiment, one side may include a power pad and the opposite side may include a ground pad, and the other two sides may not include any pads. Adjacent pads moving around the periphery of the component 14 may have the opposite voltage assigments (that is, one pad may be assigned to $V_{Core}$, the next to $V_{SS}$, etc.). The pads 70A–70G are shown extending into the component package 14B (dotted portion of each pad), so as to make contact with the power and ground planes within the component package 14B.

In some embodiments, the entirety of the top of component 14, with the exception of the area covered by the integrated circuit 14A, may be available for the installation of bypass capacitors. As power/current requirements of the integrated circuit 14A increase, maximizing the space near the integrated circuit 14A on which bypass capacitors can be installed may be of benefit.

It is noted that by having the power and ground pads in the same positions on each side of the component 14, one design of the power board 16 may be oriented in any direction over the component 14. That is, the power board 16 may be oriented so that the portion of the power board that extends beyond the edge of the component 14 may extend beyond any of the sides of the component 14. Viewed in another way, with the component 14 oriented as shown in FIG. 8, the power board may be aligned at 0 degrees, 90 degrees, 180 degrees, or 270 degrees.

Figure 9:
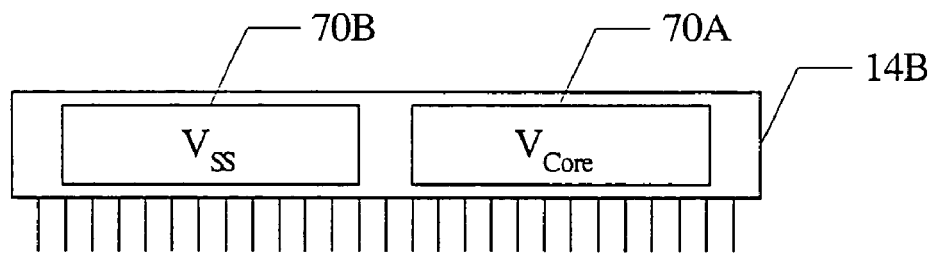
FIG. 9 is a side view of one embodiment of the component, illustrating the side pads.

FIG. 9 is a side view of the component package 14B, illustrating the power ($V_{Core}$) and ground ($V_{SS}$) pads 70A and 70B, for example. As illustrated in FIG. 9, each pad may cover approximately ½ of the side, except for a small amount of clearance around each pad.

The pads 70A–70H may be formed of any conductive material. In one embodiment, the pads 70A–70H may be a beryllium-copper alloy. While generally any mixture of beryllium and copper may be used, in some embodiments a beryllium content of about 0.25% to 2.0% by weight may be used. In other embodiments, copper may be used to form the pads, or any other conductive material may be used.

Figure 10:
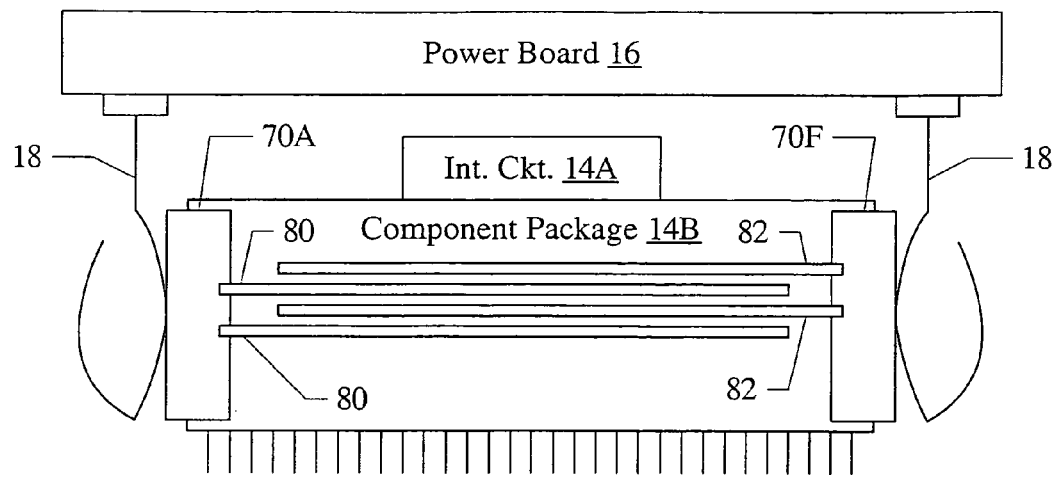
FIG. 10 is a block diagram of one embodiment of the power board and the component having side pads, illustrating connection between the power board and the component and within the component.

FIG. 10 illustrates a block diagram of one embodiment of the power board 16, the component 14, and the spring connectors 18. The embodiment of FIG. 10 may be used in the embodiment of FIG. 1 in a manner similar to the like numbered components of FIG. 1. In the illustrated example, the pads 70A and 70F are shown on each side of the component package 14B. A cross section of the component package 14B is also shown, including power planes 80 and ground planes 82. The power planes 80 make electrical connection with the pad 70A, while the ground planes 82 may electrical connection with the pad 70F. As mentioned above, in one embodiment, the component package 14B may comprise a circuit board having layers of conductors and insulating material to connect the pins 14C to the integrated circuit 14A (the signal layers are not shown in FIG. 10). Additionally, the planes 80 and 82 may be layers that may be used to supply power supply voltage ($V_{Core}$) and ground ($V_{SS}$) to the integrated circuit 14A.

Figure 11:
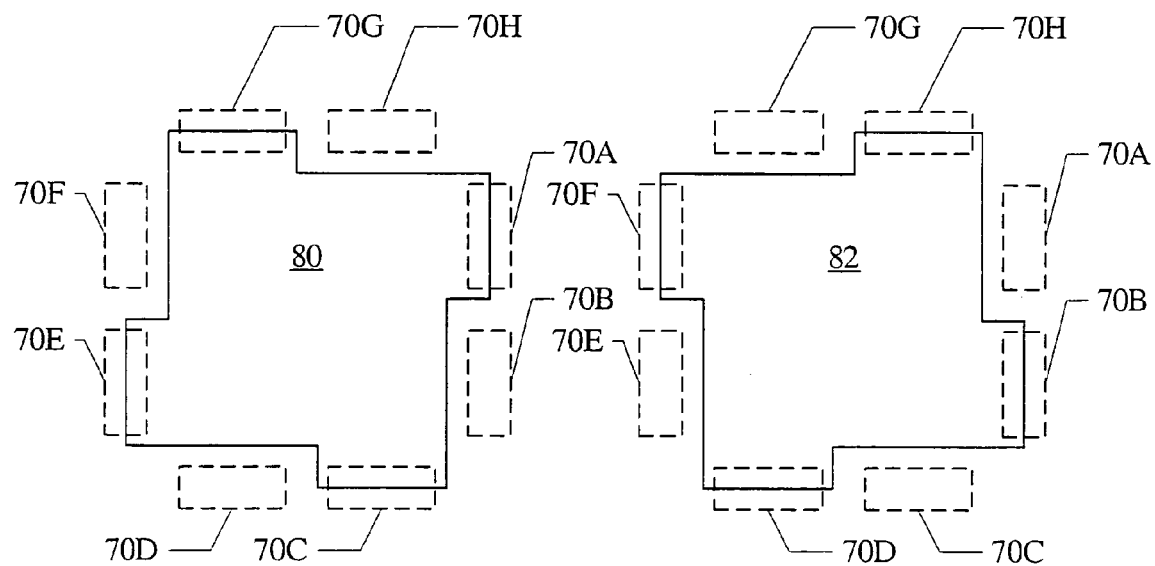
FIG. 11 is a top view of one embodiment of a power or ground plane within the component package.

Each of the planes may be designed to permit electrical connection with the pads 70A–70H assigned to the voltage for that plane and to remain insulated from the pads 70A–70H assigned to the other voltage. Since each side includes a pad for each type of voltage in the present embodiment, the power planes 80 and the ground planes 82 may be as shown in FIG. 11. The pads 70A–70H are shown in dotted form for reference. Other embodiments may differ, depending on the number and arrangement of side pads. Vias to permit signal connection through the planes 80 and/or 82 may be provided, in some embodiments. Such vias are not shown in FIG. 11.

Spring connectors 18 may be used to electrically couple the component 14 and the power board 16. However, in the embodiment of FIG. 10, the spring connectors may apply a more horizontal compression onto the pads 70A–70H, rather than a vertical compression such as is shown in FIG. 1. Exemplary spring connectors, for example, may be obtained from Laird Technologies. In other embodiments, an essentially permanent connection (e.g. soldering) may be made, if desired.

It is noted that, in some embodiments, a "collar" may be placed around the component 14 and in proximity to the component 14, to compress the spring connectors 18 against the pads 70A–70H. Such compression may increase the contact surface of the connectors 18 against the pads 70A–70H. In some embodiments the collar, when viewed from above, may have a "self-alignment" feature comprising an inclined plane shape sloping toward the pads 70A–70H. Thus, as the connectors 18 are pushed into contact with the pads 70A–70H, the collar forces the connectors 18 into close proximity with the pads 70A–70H and may force more contact surface between the connectors 18 and the pads 70A–70H by applying compressive pressure to the connectors 18 in the direction of the pads 70A–70H.

The spring connectors 18 may comprise one connector that contacts substantially all of the length of the corresponding pad 70A–70H, or may comprise multiple connectors (e.g. one per pad on the power board 16), each of which contacts the corresponding pad 70A–70H. It is noted that, while the pads 48 on the power board 16 as shown in FIGS. 2 and 3 were described as alternating, among adjacent pads, between power and ground, the pads 48 may be arranged differently for the embodiment of FIG. 10. The pads above each pad may continuously be either power or ground, depending on whether the pad is a power or ground pad. Thus, the pads along any given edge of the ring of pads shown in FIG. 3 may comprise one half power and one half ground, with each type of pad grouped together on either end of that edge. Furthermore, in other embodiments, the power and ground pads on the power board 16 may be similar in length to the pads on the component 14, and there may be fewer such pads, if desired.

While two power planes 80 and two ground planes 82 are shown in FIG. 10, other embodiments of the component package 14B may include more of each plane, or only one of each plane, as desired. It is noted that, while power and ground pads 70A–70H are shown on each of the sides of the package 14B in the embodiment of FIGS. 8–11, other embodiments may include pads on some of the sides and not others, as desired.

Turning now to FIG. 12, a bottom view of another embodiment of the power board 16 is shown, for use with the component 14 have the side pads 70A–70H. Similar to the embodiment of FIG. 3, the embodiment of FIG. 12 includes the opening 40 for the heat sink, the dotted box 42 illustrating the outline of the component 14 when the power board 16 is in place above the component 14, the set of holes 44, and the solder connections 46. Additionally, in this embodiment, a set of connectors 90A–90H are shown attached to the bottom of the power board 16.

Each of the connectors 90A–90G include a conductive member and one or more compressible conductors attached to the conductive member. For example, the connector 90E may include a conductive member 92 and a compressible conductor 94. The compressible conductors may extend into the area defined by the dotted box 42, and thus when the power board 16 is in place over the component 14, the compressible conductors may be compressed against the side pads 70A–70H, thereby making electrical connection with the side pads 70A–70H. That is, the compressible conductors may apply a force against the side pads 70A–70H (inward toward the component 14) to maintain the electrical connection.

The connectors 90A–90G may be attached to the bottom of the power board 16 in any desired fashion. For example, the connectors 90A–90G may include pins (shown in FIGS. 13 and 14) that may be soldered to a power plane or ground plane of the power board 16 (or to a pad connected to the plane through a via in the power board 16) dependent on whether the particular connector 90A–90G is to make contact with a power pad or a ground pad. For example, if the power board 16 were used with the embodiment of the component 14 shown in FIG. 8, the connectors 90A, 90C, 90E, and 90G would be connected to the power plane and the connectors 90B, 90D, 90F, and 90H would be connected to the ground plane.

In some embodiments, connectors 90A–90H may be provided for all four sides of the component 14. In other embodiments, connectors 90A–90H may be provided for fewer than the total number of sides. For example, connectors 90G–90H are shown in dotted form in FIG. 12 to denote that these connectors may be optional in the illustrated embodiment. That is, the connectors 90A–90F may be provided to make contact with three sides of the component 14 while the connectors 90G–90H may be omitted and contact with the remaining side of the component 14 may not be made. In use, for this embodiment, the connectors 90G–90H may correspond to the side of the component 14 that faces the portion of the socket 12 that extends up to provide the mechanical function of applying or releasing pressure on the pins 14C via a handle or other mechanical actuator (e.g. the left side of the socket 12 in FIG. 1). Thus, the side of the component 14 that faces that portion of the socket may not, in some embodiments, be accessible to make connection with the connectors 90G–90H. In other embodiments, any of the connectors 90A–90B, 90C–90D, or 90E–90F may be omitted to permit various orientations of the power board 16 with respect to the socket 12. In still other embodiments, connectors may be provided for even fewer sides of the component 14, although at least one power pad and one ground pad of the component 14 may be contacted.

As used herein, a conductive member may be any member formed of conductive material or including conductive material to permit electrical current conduction between the power board 16 and the compressible conductor or conductors attached to the conductive member. For example, in some embodiments, the conductive member may be formed entirely from conductive material. In other embodiments, conductive material making the connection between the compressible conductor and the connection to the power board 16 may be included in bulk material that is non-conductive. Conductive material may be any material which conducts current during use. For example, conductive material may include materials such as copper, gold, nickel, aluminum, tin, silver, tungsten, copper-beryllium, any combination of the above materials, or any combination of one or more of the above materials and small amounts of non-conductive materials (e.g. to provide mechanical stability). A compressible conductor may be any conductor which is designed to compress under pressure while providing electrical conduction, and which is designed to return to approximately its original shape when the pressure is released.

The embodiment of the power board 16 shown in FIG. 12 may be used to couple to the VRM 28, similar to the embodiment shown in FIG. 1. In other embodiments, the VRM 28 may be integrated onto the power board 16 and a connector may be provided to connect the power board 16 to the VRM connector in the motherboard 10.

Turning now to FIG. 13, a view of one embodiment of a connector (e.g. connector 90E) is shown from one end of the conductive member 92. That is, in the embodiment of FIG. 12, the connectors 90A–90H include an elongated conductive member 92, and the view in FIG. 13 may be one end of the elongated member 92. FIG. 14 is a view from the top of the connector 90E (that is, the view in FIG. 14 may be from the vantage point of the bottom of the power board 16 when the connector 90E is attached thereto). Other connectors 90A–90D and 90F–90H may be similar.

In the illustrated embodiment, the conductive member 92 may be substantially square or rectangular in cross section. The conductive member 92 may include a first surface 100 and a second surface 102 which, in the illustrated embodiment, may be substantially perpendicular to each other. That is, the surface 100 and the surface 102 may be nominally perpendicular, although manufacturing variations may cause the surfaces to vary from being exactly perpendicular. Other embodiments may have different cross sections (e.g. a triangular cross section, having surfaces 100 and 102 and as two sides of the triangle, may be used as well as embodiments having cross sections in which one or both of the surfaces 100 and 102 are not flat).

The compressible conductor 94 is shown attached to the surface 102 in FIG. 13. The compressible conductor 94 may be, for example, soldered to the conductive member 92. Alternatively, the compressible conductor 94 may be bonded to the conductive member 92, or in any other fashion attached in an essentially permanent fashion to the conductive member 92. The compressible conductor 94 in the embodiment of FIG. 13 includes a curved portion that makes contact with one of the side pads 70A–70G of the component 14 during use. The curved portion may deform under pressure, flattening somewhat against the side pad. Thus, a greater surface area of the compressible conductor 94 may be in contact with the side pad, which may enhance the electrical connection.

In the illustrated embodiment, the curved portion may be essentially a circular arc or oval arc. In other embodiments, the curved portion may be more irregular in shape, including flat portions or variations in the curvature, as desired. In some implementations, the compressible conductor 94 may be similar to the various electro-magnetic interference (EMI) shielding gaskets available from Laird Technologies (Delaware Water Gap, Pa.), or an EMI shielding gasket may be used as the compressible conductor 94. For example, various Fingerstock EMI shielding gaskets from Laird Technologies may be used. Particularly, the symmetrical slotted shielding gaskets or solid top symmetrical slotted shielding gaskets from Laird Technologies may be used.

As can be seen in FIG. 14, the compressible conductor 94 may have a solid portion along the attachment point to the conductive member 92, and may have one or more slots 106 through the curved portion. The slotting may permit easier compression of the compressible conductor 94 (as compared to if the compressible conductor 94 were not slotted). In some embodiments, there may be slotting in the compressible conductor 94 but there may be a solid piece down the center of the compressible conductor (at the apex of the curved portion). For example, the solid top symmetrical slotted shielding gaskets may have the solid piece.

Extending from the surface 100 are one or more conductors 104. The conductors 104 may be used to connect the connector 90E to the power board 16. For example, the conductors 104 may be connected to any of the power or ground plane layers of the power board 16 (dependent on whether the connector 90E is to supply power or ground to the component 14 during use). The conductors 104 may be formed as part of the conductive member 92. Alternatively, holes may be drilled into the conductive member 92 and the conductors 104 may be inserted into the holes and affixed thereto (e.g. soldered, bonded, etc.). Any number of conductors 104 may be provided in various embodiments.

In the illustrated embodiment, there is a space 108 underneath the compressible conductor 94. In some embodiments, a compressible material may be inserted into the space 108 to provide additional resiliency. For example, a piece of rubber may be inserted. Alternatively, a silicone rubber material may be applied to the space 108. Any compressible material may be used, as desired.

Figures 15, 16:
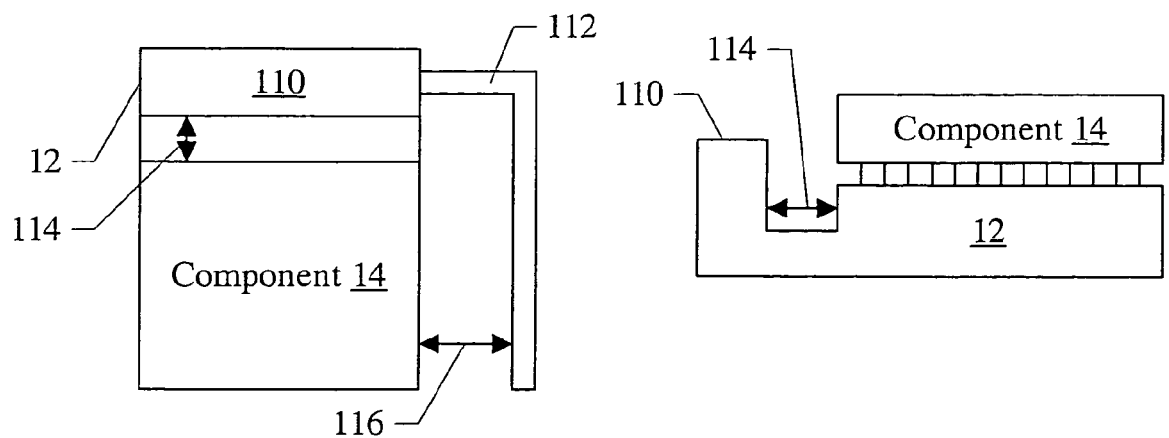
FIG. 15 is a top view of one embodiment of a socket with a component inserted therein.
FIG. 16 is a side view of one embodiment of the second with the component inserted therein.
Figure 17:
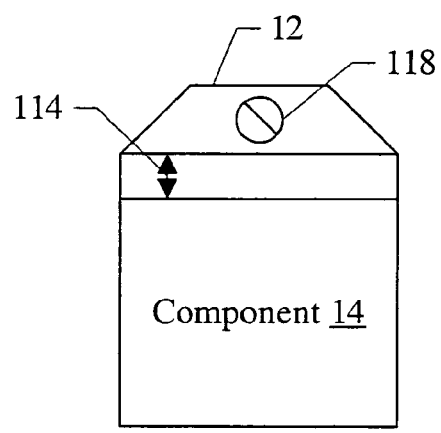
FIG. 17 is a top view of another embodiment of a socket with a component inserted therein.

In some embodiments, the power board 16 with the connectors 90A–90H (or a subset thereof) may be used with any socket 12. In other embodiments, it may be desirable to modify the socket 12 to ease the size constraints for the connectors 90A–90H. FIGS. 15–17 illustrate various sockets 12.

FIG. 15 illustrates a top view of one embodiment of the socket 12 with the component 14 inserted therein. FIG. 16 illustrates a side view of the embodiment. The socket 12 includes a raised portion 110 for connecting to the socket handle 112, as well as the portion that extends underneath the component 14 (not visible in FIG. 15). The socket handle 112 is used to lock and unlock the socket 12. That is, in the locked state, the component 14 is held in place in the socket 12 and, in the unlocked state, the component 14 is easily removed from the socket 12. In the illustrated embodiment, the sides of the socket 12 may be flush with the sides of the component 14, so that the connectors 90A–90H may extend down below the top of the socket 12 on those sides, if desired. In some embodiments, a channel 114 may be provided in the socket 12 between the raised portion 110 and the component 14 to provide additional room for the connectors 90A–90H on that side of the component 14. As shown in FIG. 16, the channel 114 may be lower than the portion of the socket 12 that is underneath the component 14. In some embodiments, the distance 116 between the side of the socket 12 and the handle 112 may be increased, to similarly allow additional space for the connectors 90A–90H on that side of the component 14.

FIG. 17 is another embodiment of a socket 12 that uses a screw 118 to lock and unlock the component 14 in the socket 12. Such an embodiment may provide additional freedom for the connectors 90A–90H since the socket handle is not an issue. In some embodiments, the socket 12 as shown in FIG. 17 may include a channel 114, similar to the embodiment of FIGS. 15 and 16.

Figure 18:
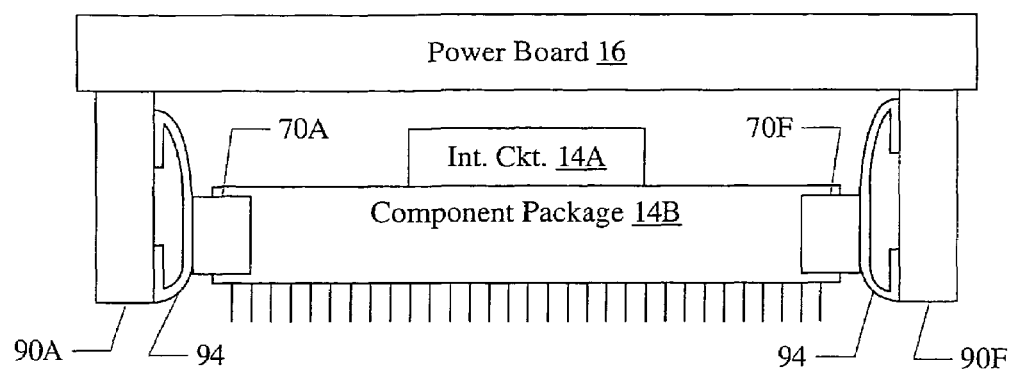
FIG. 18 is a block diagram of one embodiment of the power board and the component having side pads, illustrating connection between the power board and the component using the connector shown in FIGS. 13 and 14.

Turning now to FIG. 18, a block diagram illustrating the power board 16, the component 14 having the side pads (e.g. pads 70A and 70F), and corresponding connectors (e.g. connectors 90A and 90F) when the power board 16 is in place over the component 14. FIG. 18 illustrates the deforming of the compressible connectors 94 on each of the connectors 90A and 90F and making electrical contact with the side pads 70A and 70F.

Figure 19:
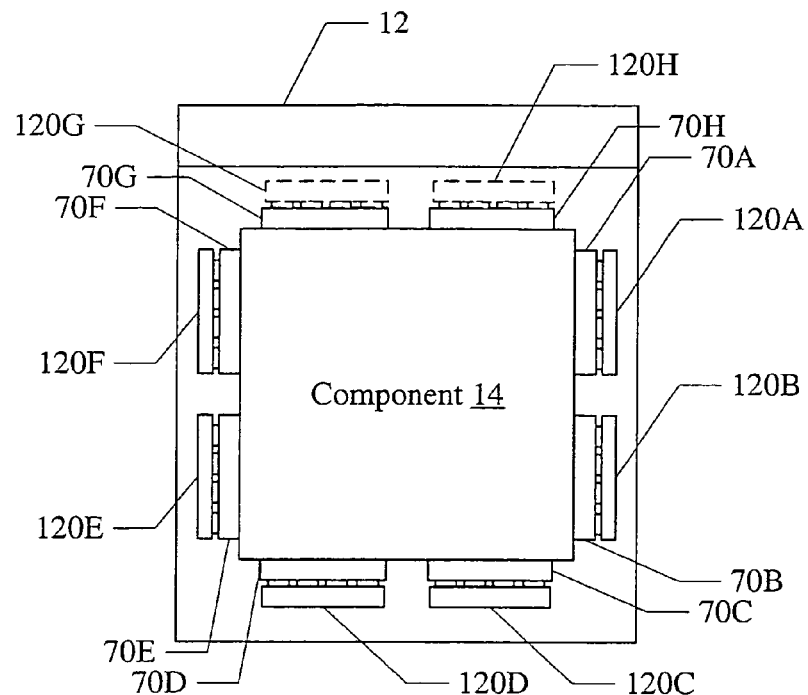
FIG. 19 is a block diagram of one embodiment of a socket having connectors attached thereto.

Turning next to FIG. 19, a block diagram of another embodiment of the socket 12 having connectors 120A–120H attached thereto and the component 14 having the side pads 70A–70F inserted therein.

Figure 24:
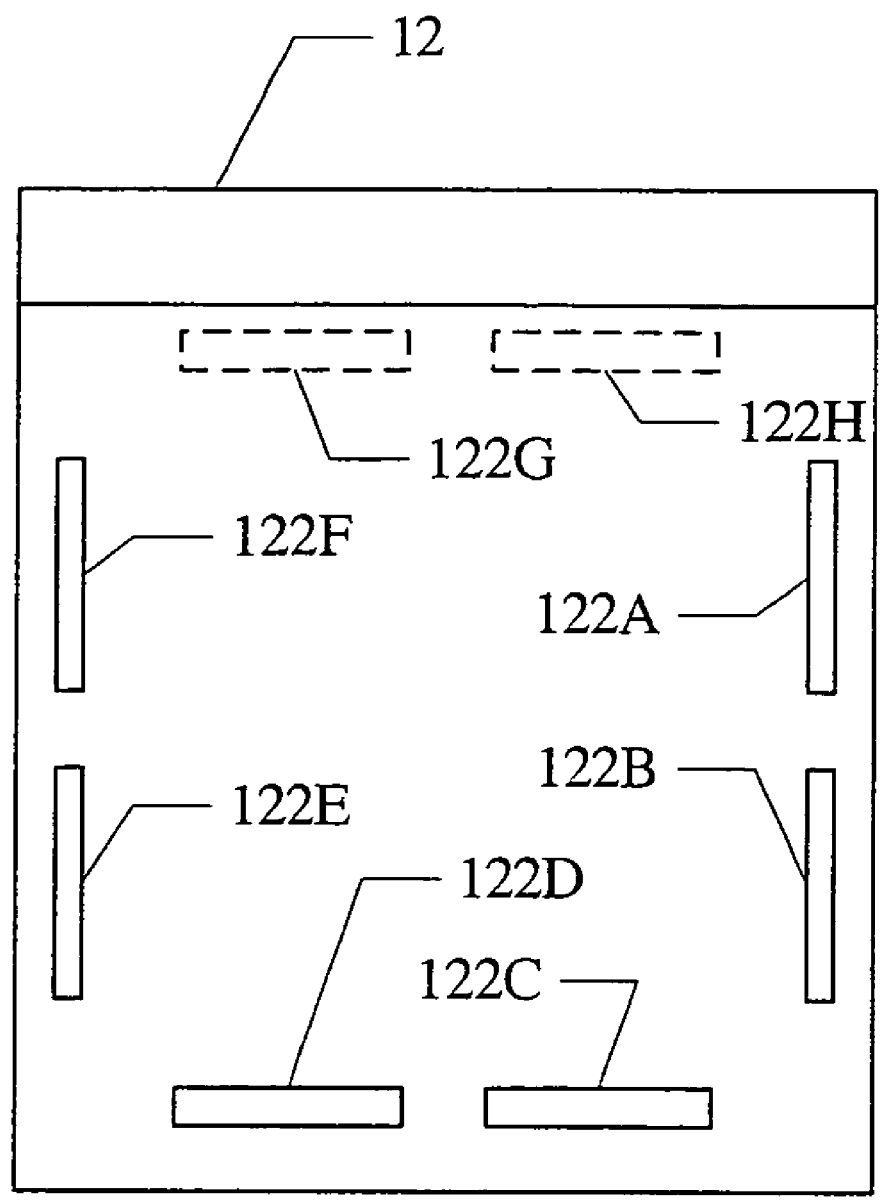
FIG. 24 is a block diagram of one embodiment of the socket shown in FIG. 19, illustrated indentations therein.

In this embodiment, the connectors 120A–120H are mechanically attached to the socket 12, arranged around the area where the component 14 is placed during use, with the compressible conductors extending into the area occupied by the component 14 so that the compressible conductors are compressed with the component 14 is inserted into the socket 12. In some embodiments, the connectors 120A–120H may be molded into the socket 12. In other embodiments, the socket 12 may be molded with an indentation for each connector 120A–120H. The connectors 120A–120H may be attached to the indentations (e.g. glued in, or otherwise attached in an essentially permanent fashion to the indentations). FIG. 24 is a block diagram of one embodiment of the socket having the indentations 122A–122H. In some embodiments, one or more of the connectors 120A–120H may be optional (e.g. the connectors 120G and 120H are shown in dotted form to indicate that they are optional in the illustrated embodiment). Indentations in the socket 12 corresponding to the optional connectors are also optional (e.g. the indentations 122G and 122H are shown in dotted form in FIG. 24 to indicate that they are optional).

In some embodiments, connectors 120A–120H may be provided for all four sides of the component 14. In other embodiments, connectors 120A–120H may be provided for fewer than the total number of sides. In still other embodiments, connectors may be provided for even fewer sides of the component 14, although at least one power pad and one ground pad of the component 14 may be contacted.

As mentioned above, the connectors 120A–120H are mechanically attached to the socket 12. However, the connectors 120A–120H may generally be electrically isolated from the socket 12. The connectors 120A–120H may be designed to connect to the power board 16 placed over the top of the component 14 during use, and may supply power and ground connection between the power board 16 and the component 14 through the side pads 70A–70H. In some embodiments, the connectors 120A–120H that are used to connect to ground pads (e.g. connectors 120B, 120D, 120F, and 120H for the embodiment of the component 14 shown in FIG. 8) may be electrically coupled to the ground of the socket (and ultimately to the ground of the motherboard on which the socket 12 is installed). The current supplied to the component 14 through the power supply pads still returns to ground through the power board 16, but the connection may help couple the ground of the component 14 and the ground of the motherboard together. In other embodiments, the connectors that connect to ground pads may be electrically isolated from the socket/motherboard.

Figures 20, 21:
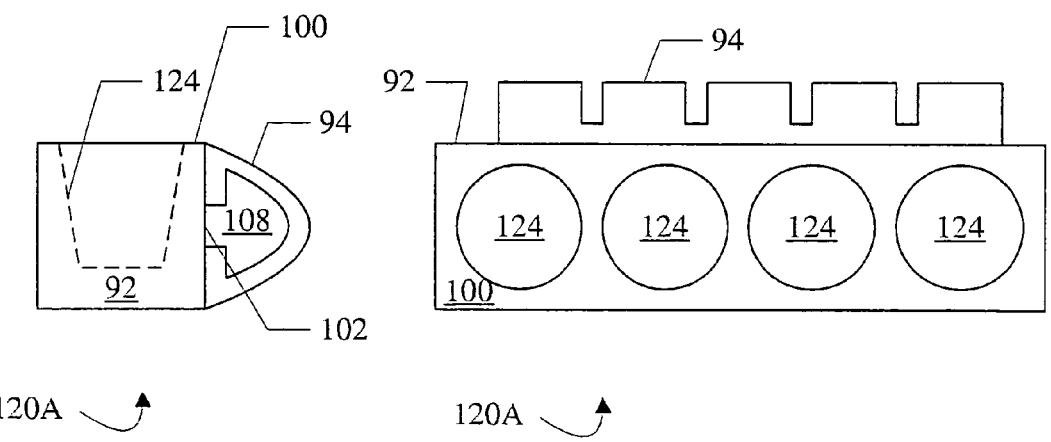
FIG. 20 is an end view of one embodiment of a connector shown in FIG. 19.
FIG. 21 is a top view of one embodiment of the connector shown in FIG. 19.

FIG. 20 is an end view of one embodiment of the connector 120A, and FIG. 21 is top view of the connector 120A (that is, the view of FIG. 21 is the opposite side of the connector 120A than the side that connects to the socket 12). Other connectors 120B–120H may be similar.

Similar to the connectors 90A–90H, the connector 120A comprises a conductive member 92 and a compressible conductor 94 connected to the conductive member 92. The conductive member 92 may have surfaces 100 and 102, which may be substantially perpendicular to each other. There may be a space 108 underneath the compressible conductor 94 into which a compressible material may optionally be inserted. However, rather than having conductors 104 extending from the surface 100, one or more holes 124 may be formed in the conductive member 92. A hole 124 are illustrated in dotted form in FIG. 20 (since the holes are not visible from the end). Any number of holes 124 may be provided, in some embodiments.

The holes 124 are provided for the insertion of conductors from the power board 16, to make electrical contact between the power board 16 and the conductive member 92. In some embodiments, the sides of the holes 124 (extending downward from the surface 100 in FIG. 20) may be inclined, such that the opening in the surface 100 for a hole 124 may be larger, in cross sectional area, than the cross sectional area at the bottom of the hole 124. Such a design may facilitate alignment of the power board 16 to the connectors 120A–120H. The power board 16 may have conductors (e.g. pins) attached to the bottom side of the power board 16 to align to the holes 124 in the connectors 120A–120H. Having the larger openings in the surface 100 may facilitate insertion of the conductors into the connectors 120A–120H. As the conductors from the power board 16 are pushed deeper into the holes 124, the incline in the sides of the holes may tighten about the conductors, making electrical and mechanical connection thereto. In other embodiments, the sides of the holes may be substantially perpendicular to the surface 100.

In some embodiments, the connectors 120A–120H may further comprise inserts for the holes 124 to prevent corrosion. For example, the inserts may be nickel-plated or gold-plated. Alternatively, in some other embodiments, the conductive member 92 may be nickel-plated or gold-plated after formation of the holes 124 therein. In still other embodiments, no plating or inserts may be used.

Figure 22:
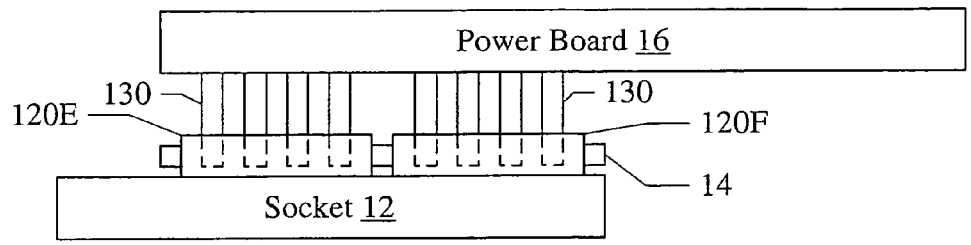
FIG. 22 is a side view of one embodiment of the power board coupled to the connectors and socket shown in FIG. 19.

Turning next to FIG. 22, a side view one embodiment of the power board 16 (having a plurality of conductors 130 connected to a bottom side thereof), the socket 12, the component 14, and the connectors 120E–120F. FIG. 22 illustrates the conductors 130 inserted into the holes 124 in the connectors 120E–120F during use. The portion of the conductors 130 that are within the holes 124 are shown in dotted form in FIG. 22.

Figure 23:
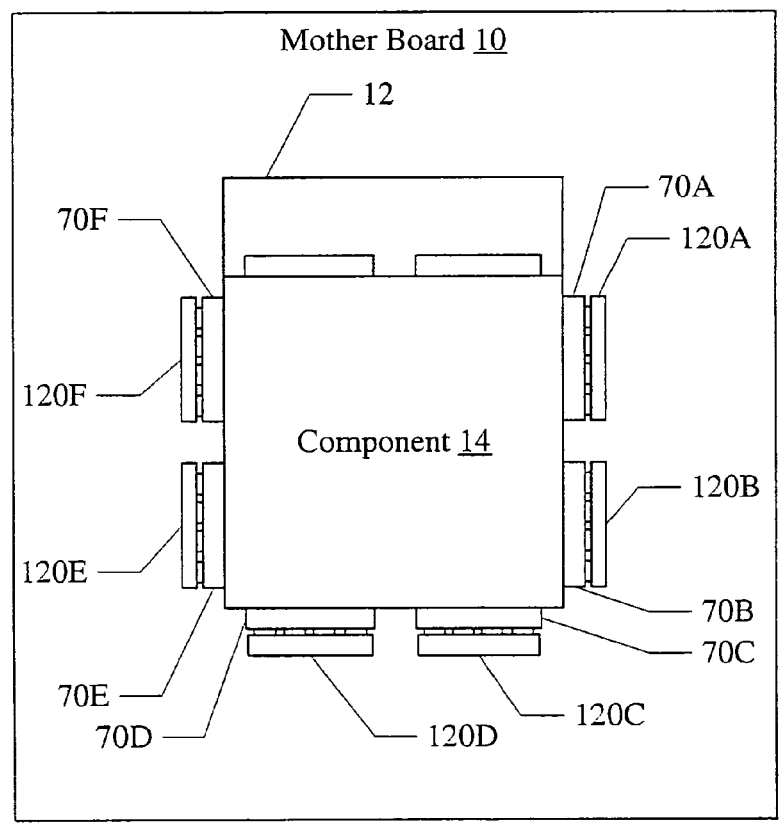
FIG. 23 is a block diagram of one embodiment of a motherboard with connectors and a socket attached thereto.

Turning now to FIG. 23, another embodiment of the motherboard 10 with the socket 12 and the component 14 inserted into the socket is shown. In the embodiment of FIG. 23, the connectors 120A–120F are mechanically attached to the motherboard 10, in proximity to the socket 12 and to make contact with the side pads 70A–70F. In this embodiment, the socket 12 may have sides that are approximately flush with the component 14 (to permit contact between the connectors 120A–120F and the side pads 70A–70F). Alternatively, the sides of the socket 12 may not be flush and the connectors 120A–120F may be mounted and/or shaped to extend over the sides of the socket 12 to make contact with the side pads 70A–70F.

Figure 25:
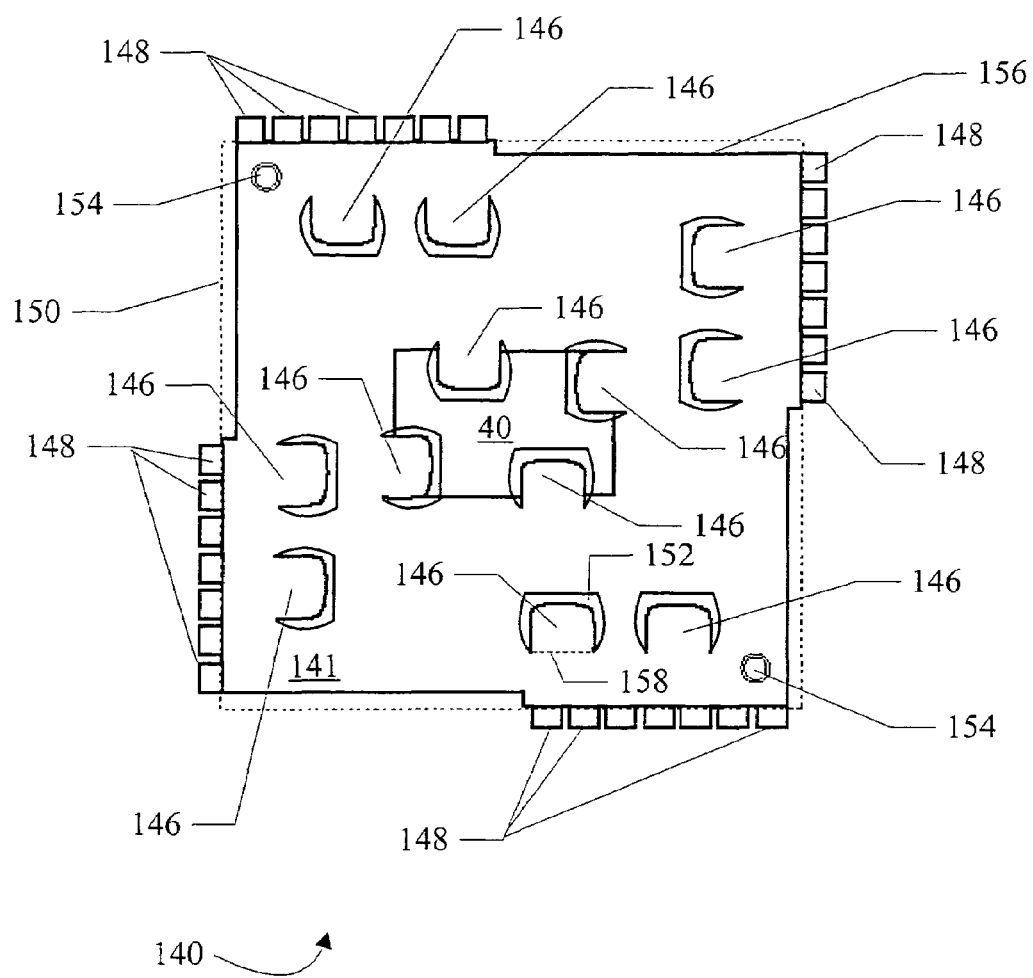
FIG. 25 is a top view of one embodiment of a $V_{Core}$ plate for use in another embodiment of coupling a power board to a component.
Figure 26:
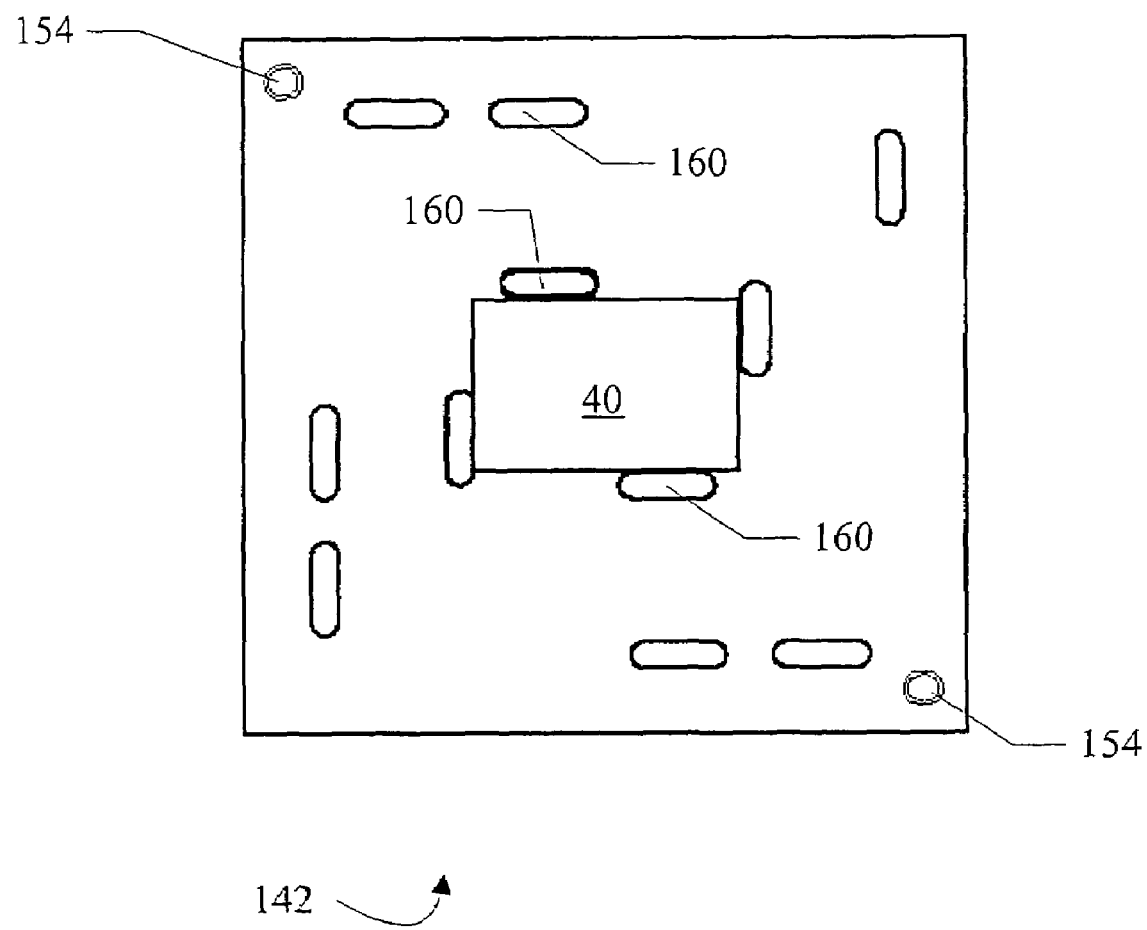
FIG. 26 is a top view of one embodiment of an insulating layer for use in another embodiment of coupling a power board to a component.
Figure 27:
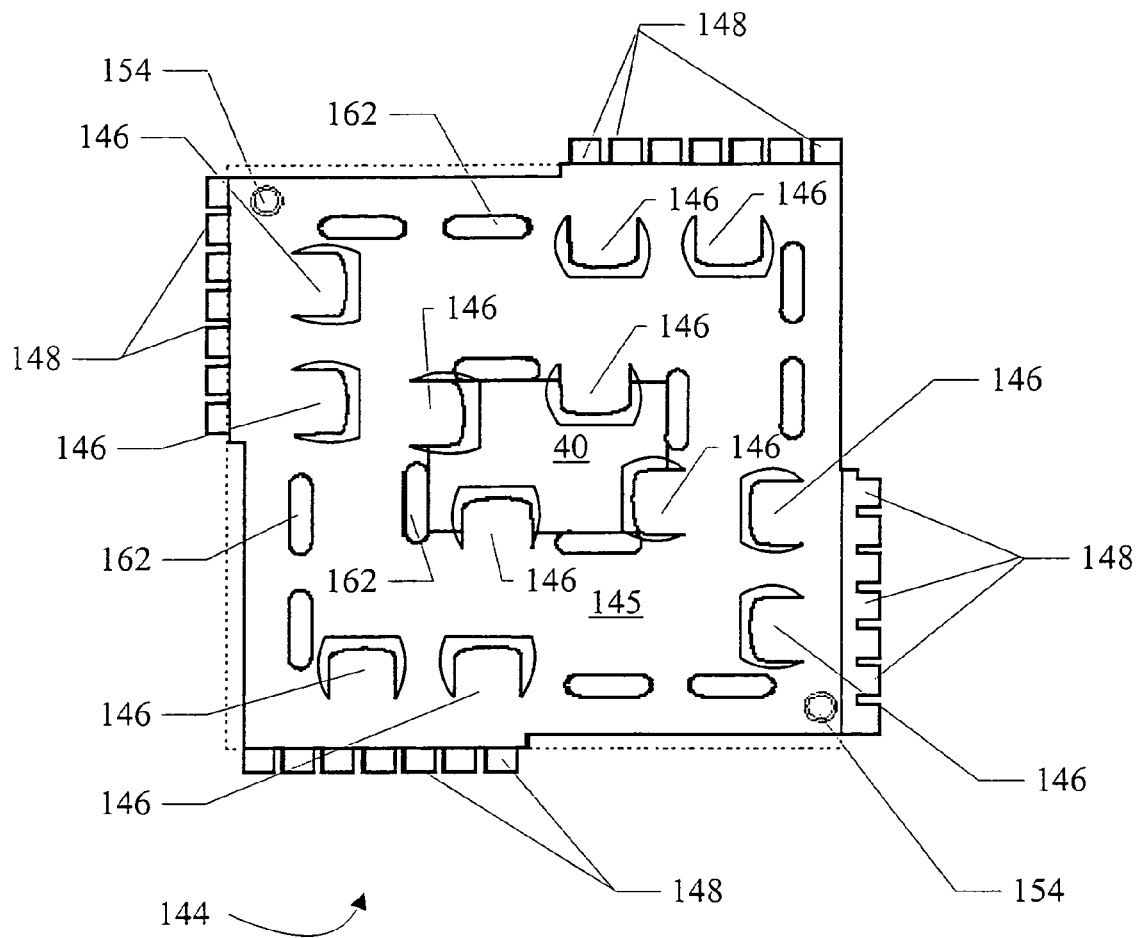
FIG. 27 is a top view of one embodiment of a $V_{SS}$ plate for use in another embodiment of coupling a power board to a component.

Turning next to FIGS. 25–28, another embodiment of a connector for connecting between the power board 16 and the component 14 having side pads 70A–70F is shown. More particularly, FIG. 25 illustrates one embodiment of a $V_{Core}$ layer 140, FIG. 26 illustrates one embodiment of an insulator 142, and FIG. 27 illustrates one embodiment of a $V_{SS}$ layer 144 that may be assembled together and affixed to the power board 16 to provide a connector to the component 14.

FIG. 25 is a top view of one embodiment of the $V_{Core}$ layer 140. The $V_{Core}$ layer 140 may comprise a plate 141 formed of any conductive material (e.g. copper-beryllium, in one implementation). The plate 141 may include a plurality of tabs 146. In FIG. 25, the tabs 146 are shown lying flat (e.g. approximately in the same plane as the plate 140). The tabs 146 may be bent up (e.g. to approximately a 90 degree angle with respect to the plate 141, or approximately perpendicular to the plate 141). The tabs 146 may be attached to the $V_{Core}$ plane(s) of the power board 16 to provide electrical connectivity between the layer 140 and the $V_{Core}$ plane(s). In the illustrated embodiment, the tabs 146 may be formed by cutting away material from a solid plate to provide tabs that may be bent up. In FIG. 25, the area at reference numeral 152 for one of the tabs 146 may represent the cut away material and the tab 146 may be bent up approximately along the dotted line 158 in FIG. 25. For example, the plate 141 may be stamped to perform the cutting away. In other embodiments, the tabs 146 may be preformed on the plate 141 or soldered onto the plate 141, in the approximately perpendicular position. Generally, any protrusion that may be passed through the insulator 142 and the $V_{SS}$ layer 144 to connect to the $V_{Core}$ plane(s) of the power board 16 may be used.

Figure 28:
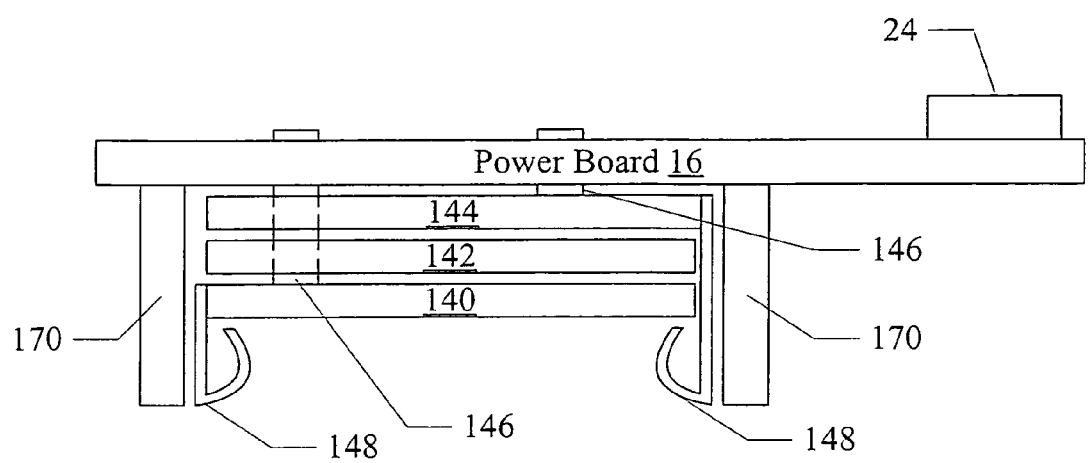
FIG. 28 is a side view of one embodiment of the power board and connector when assembled.

The $V_{Core}$ layer 140 may be further comprise a set of spring connectors (some of which are labeled with reference numeral 148 in FIG. 25) connected to the plate 141, that may make electrical contact with the side pads 70A–70F that are designated as $V_{Core}$ pads when the power board 16 is in place over the component 14. FIG. 28 illustrates a side view of the assembled connector and power board, illustrating one embodiment of the spring connectors 148.

The area enclosed by the solid border (reference numeral 156) in FIG. 25 may comprise the conductive material forming the $V_{Core}$ plate 141. Additionally shown in FIG. 25 is an indication of the border of the component 14 (the dotted line, reference numeral 150) for reference. The dotted border 150 may also be an indication of the border of the insulator 142. Approximately centered in the plate 141 is a box corresponding to the opening 40 for the heat sink 20. The portion of the plate 141 corresponding to the opening 40

(not including the tabs 146 that extend into the opening 40 prior to the tabs being bent up) may be removed to permit passage of the heat sink 20 through the plate 140 when assembled to the power board 16.

Additionally shown in the embodiment of FIG. 25 are a set of index holes 154. Pins or other rods may be passed through the index holes 154 to align the layers 140 and 144 and the insulator 142 in the illustrated embodiment. The power board 16 and the component 14 may also have corresponding index holes for alignment purposes, in some embodiments.

FIG. 26 illustrates a top view of one embodiment of the insulator 142. The insulator 142 may have approximately the same border as the component 14, and may provide insulation between the $V_{Core}$ plate 140 and the $V_{SS}$ plate 144 when assembled as shown in FIG. 28. The insulator 142 may be formed of any insulating material. In one particular embodiment, the insulator 142 may comprise plastic. The insulator 142 may include the opening 40, and may further include slots (some of which are labeled with reference numeral 160) that align to the tabs 146 of the layer 140 when assembled. That is, the tabs 146 may pass through the slots 160 when assembled as shown in FIG. 28. The insulator 142 may further include index holes 154.

FIG. 27 is a top view of one embodiment of the $V_{SS}$ layer 144. The $V_{SS}$ layer 144 may include a plate 145 that may be formed from conductive material and my comprise a plurality of tabs 146, similar to the tabs 146 in the $V_{Core}$ layer 140 but placed in different locations. The tabs 146 may, in some embodiments, be formed in a manner similar to the tabs 146 on the layer 140, and may be bent up to approximately a 90 degree angle (or approximately perpendicular to the plate 145). Alternatively, the tabs 146 may be preformed on the plate 145 or soldered onto the plate 145, in the approximately perpendicular position. Additionally, the plate 145 may include slots (some of which are labeled with reference numeral 162) similar to the slots 160 in FIG. 26, to permit passage of the tabs 146 from the plate 141. The slots 162 may be insulated from the conductive material of the plate 145. In some embodiments, for example, the slots 162 may be through-hole plated in the plate 145. Similar to the plate 141, the portion of the plate 145 corresponding to the opening 40 may be removed (excluding the tabs 146) to permit passage of the heat sink 20. The plate 145 may also include spring connectors 148, similar to the plate 140. Additionally, index holes 154 may be included.

Figure 29:
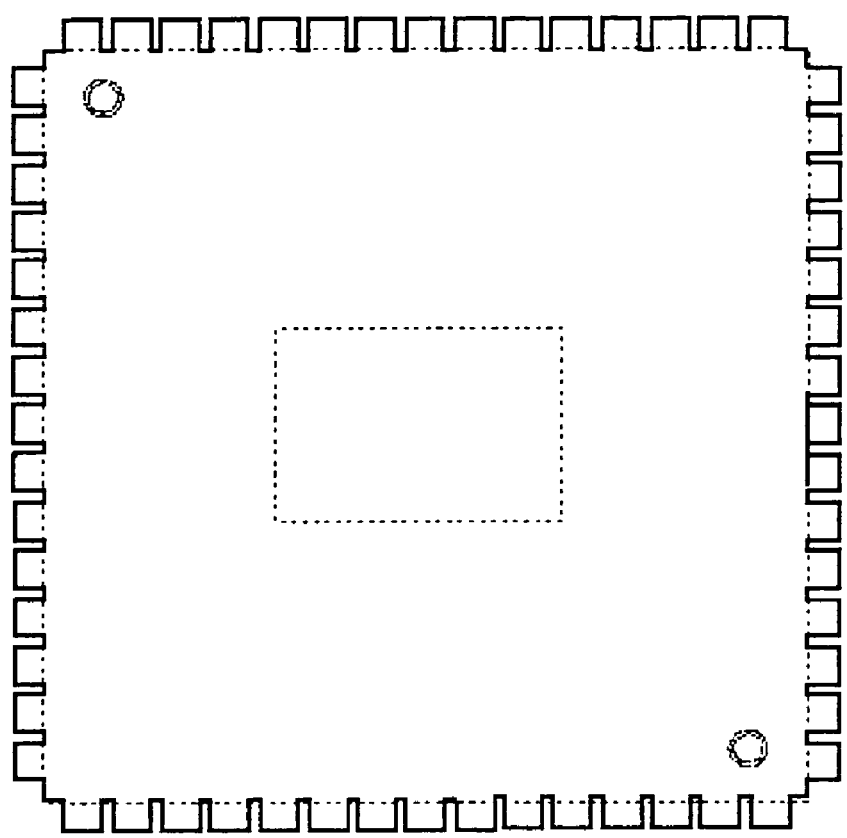
FIG. 29 is a block diagram of one embodiment of a plate that may be used to form the $V_{Core}$ and $V_{SS}$ plates shown in FIGS. 25 and 27.

In some embodiments, a solid plate of conductive material with spring connectors 148 attached around substantially all of the periphery of the plate may be used to make the layers 140 and 144. The portions of the spring connectors that are not used for the given layer 140 or 144 (along with a small amount of the adjoining conductive material) may be cut away. Additionally, the tabs 146 (and the slots 162) may be formed by stamping the solid plate. The remaining material corresponding to the opening 40 may also be removed (e.g. by stamping or otherwise cutting away the material). FIG. 29 is a block diagram of one example of a plate and spring connectors that may be used to make the layers 140 and 142.

It is noted that the number and placement of the tabs 146 on the plates 141 and 145 may be varied in other embodiments, as desired. As used herein, a plate may comprise a substantially flat material.

FIG. 28 is a side view of one embodiment of the power board 16, the layers 140 and 144, and the insulator 142 when assembled (except that spring connectors 148 that are included along the side of layers 140 and 144 that is visible to the viewer in FIG. 28 are not shown, as they would obscure the view of the layers 140 and 144 and the insulator 142 in FIG. 28). Spring connectors 148 are illustrated for this embodiment. Generally, any form of connector 148 may be used which, when the power board 16 is installed in place over the component 14, applies an inward pressure on the pads 70A–70F to provide electrical connection. Also illustrated in FIG. 28 are exemplary tabs 146 from each of the layers 140 and 144. The tab 146 from the layer 140 extends through the insulator 142 and the layer 144 (shown in dotted form passing through the insulator 142 and the layer 144 in FIG. 28). Other tabs 146 from the layer 140 may similarly extend through the insulator 142 and the layer 144 to the power board 16 in their respective positions. The tab 146 from the layer 144 extends to the power board 16. Other tabs 146 from the layer 144 may similarly extend to the power board 16 from their respective positions.

The power board 16 may be connected to the tabs 146 in any desired fashion that provides electrical connection to the appropriate $V_{Core}$ or $V_{SS}$ plane(s) in the power board 16. For example, through-hole plating may be used.

Also shown in the embodiment of FIG. 28 is a barrier 170. The barrier 170 may optionally be provided to protect the layers 140 and 144 and the insulator 142 from undesired forces, to keep an installers fingers out of the area when the power board 16 is being installed, etc. The barrier 170 may be provided on each side of the layers 140 and 144 and insulator 142 (the portion of the barrier 170 that is provided on the side facing the viewer in FIG. 28 is not shown so as not to obscure the view of the layers 140 and 144 and the insulator 142).

In some embodiments, the spring connectors 148 may be designed to be compressed and return to approximately their original shape if not compressed beyond a specified maximum. The spring connectors 148 may be placed such that, when the power board 16 is in place over the component 14, the spring connectors 148 are not compressed beyond the specified maximum. For example, in some embodiments, the maximum may be 30% of the relaxed (non-compressed) distance.

Figure 30:
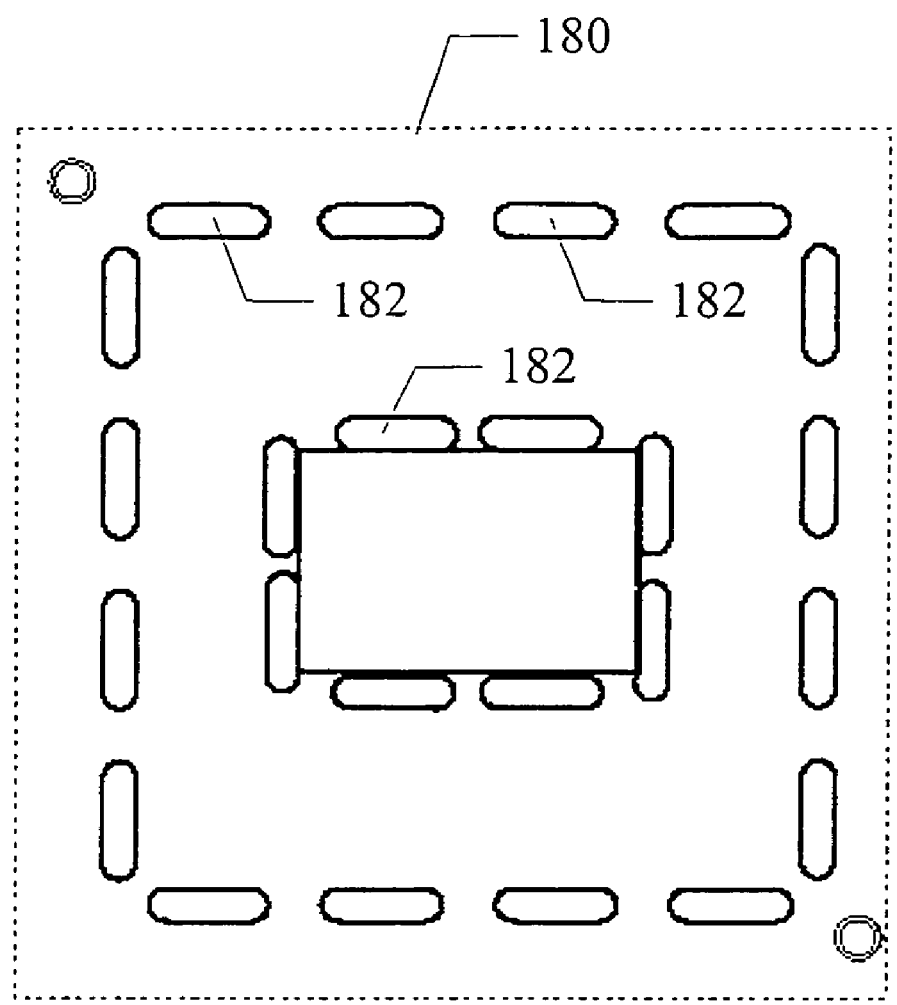
FIG. 30 is a block diagram of one embodiment of a portion of the bottom of one embodiment of a power board.

FIG. 30 is a block diagram illustrating one embodiment of the portion of the bottom of the power board 16 that is over the component 14 when the power board 16 is in place. The border of the component 14 is illustrated via the dotted line. Through-hole platings (some of which are labeled with reference numeral 182) corresponding to the tabs 146 from layers 140 and 144 are shown.

Numerous variations and modifications will become apparent to those skilled in the art once the above disclosure is fully appreciated. It is intended that the following claims be interpreted to embrace all such variations and modifications.

What is claimed is:

1. An apparatus for use with a component that includes one or more integrated circuits and a component package to which the one or more integrated circuits are coupled, the component package having a bottom comprising a plurality of conductors for providing signal connection of the component to a first circuit board, a top to which the one or more integrated circuits are coupled, and a plurality of sides, wherein at least one of the plurality of sides includes at least one power pad for providing a power supply voltage to the one or more integrated circuits and wherein at least one of the plurality of sides includes at least one ground pad for providing a ground to the one or more integrated circuits, the apparatus comprising:

a second circuit board configured to be placed over a top of the component, the second circuit board including a bottom side that faces the component during use;

two or more connectors coupled to the second circuit board, the connectors configured to make electrical contact with the power pad and ground pad on the plurality of sides of the component package when the second circuit board is in place over the top of the component, and wherein each of the two or more connectors comprises a conductive member having a first surface and one or more compressible conductors affixed to the first surface, wherein the compressible conductors, during use, make electrical contact with the power pad and ground pad on the plurality of sides of the component package, and wherein the conductive member further comprises a second surface that faces the bottom side of the second circuit board during use, and wherein the conductive member comprises one or more conductors extending from the second surface, the one or more conductors connected to the bottom side of the second circuit board.

2. The apparatus as recited in claim 1 wherein the first surface and the second surface are substantially perpendicular.

3. The apparatus as recited in claim 1 wherein the compressible conductors each comprise a curved conductor, wherein compression of the compressible conductors comprises deforming the curved conductor.

4. The apparatus as recited in claim 3 wherein there is a space between the curved conductor and the first surface, and wherein the apparatus comprises a compressible material inserted into the space.

5. The apparatus as recited in claim 1 wherein the component includes a power pad and a ground pad on each of the plurality of sides, and wherein the two or more connectors comprise connectors for less than a total number of the plurality of sides.

6. The apparatus as recited in claim 5 wherein the total number is four, and wherein connectors are provided for three of the plurality of sides.

7. An apparatus for use with a component that includes one or more integrated circuits and a component package to which the one or more integrated circuits are coupled, the component package having a bottom comprising a plurality of conductors for providing signal connection to the one or more integrated circuits, a top to which the one or more integrated circuits are coupled, and a plurality of sides, wherein at least one of the plurality of sides includes at least one power pad for providing a power supply voltage to the one or more integrated circuits and wherein at least one of the plurality of sides includes at least one ground pad for providing a ground to the one or more integrated circuits, the apparatus comprising:

a socket configured to be coupled to a first circuit board during use, wherein the socket is configured to couple a component that is inserted into the socket, during use, to the first circuit board during use; and two or more connectors mechanically attached to the socket, the connectors configured to make electrical contact with the power pad and ground pad on the plurality of sides of the component package when the component is in the socket, where the two or more connectors are configured to be electrically coupled to a second circuit board placed over a top of the component during use, and wherein at least a first connector of the two or more connectors is electrically isolated from the first circuit board, and wherein each of the two or more connectors comprises a conductive member having a first surface and one or more compressible conductors affixed to the first surface wherein the compressible conductors, during use, make electrical contact with the power pad and ground pad on the plurality of sides of the component package, and wherein the conductive member further comprises a second surface that faces the bottom side of the second circuit board during use, and wherein the conductive member comprises one or more holes in the second surface for receiving conductors attached to the bottom side of the second circuit board.

8. The apparatus as recited in claim 7 wherein the two or more connectors are configured to exert force, during use, against the power pad and the ground pad to maintain electrical connection with the power pad and the ground pad.

9. The apparatus as recited in claim 7 wherein the compressible conductors each comprise a curved conductor, wherein compression of the compressible conductors comprises deforming the curved conductor.

10. The apparatus as recited in claim 9 wherein there is a space between the curved conductor and the first surface, and wherein the apparatus comprises a compressible material inserted into the space.

11. The apparatus as recited in claim 7 wherein the component includes a power pad and a ground pad on each of the plurality of sides, and wherein the two or more connectors comprise connectors for less than a total number of the plurality of sides.

12. The apparatus as recited in claim 11 wherein the total number is four, and wherein connectors are provided for three of the plurality of sides.

13. The apparatus as recited in claim 7 wherein the first connector is used to supply the power supply voltage to the power pad during use.

14. The apparatus as recited in claim 13 wherein a second connector of the two or more connectors is used to supply the ground to the ground pad during use, and wherein the second connector is electrically isolated from the first circuit board during use.

15. The apparatus as recited in claim 13 wherein a second connector of the two or more connectors is used to supply the ground to the ground pad during use, and wherein the second connector is electrically coupled to the first circuit board during use.

16. An apparatus for use with a component that includes one or more integrated circuits and a component package to which the one or more integrated circuits are coupled, the component package having a bottom comprising a plurality of conductors for providing signal connection to the one or more integrated circuits, a top to which the one or more integrated circuits are coupled, and a plurality of sides, wherein at least one of the plurality of sides includes at least one power pad for providing a power supply voltage to the one or more integrated circuits and wherein at least one of the plurality of sides includes at least one ground pad for providing a ground to the one or more integrated circuits, the apparatus comprising:

a first circuit board;

a socket coupled to the first circuit board, wherein the socket is configured to couple a component that is inserted into the socket, during use, to the first circuit board during use; and two or more connectors mechanically attached to the first circuit board, the connectors configured to make electrical contact with the power pad and ground pad on the plurality of sides of the component package when the component is in the socket, where the two or more connectors are configured to be electrically coupled to a second circuit board placed over a top of the component during use, and wherein at least a first connector of the two or more connectors is electrically isolated from the first circuit board, and wherein the two or more connectors are configured to exert force, during use, against the power pad and the ground pad to maintain electrical connection with the power pad and the ground pad, and wherein each of the two or more connectors comprises a conductive member having a first surface and one or more compressible conductors affixed to the first surface, wherein the compressible conductors, during use, make electrical contact with the power pad and ground pad on the plurality of sides of the component package, and wherein the conductive member further comprises a second surface that faces the bottom side of the second circuit board during use, and wherein the conductive member comprises one or more holes in the second surface for receiving conductors attached to the bottom side of the second circuit board.

17. The apparatus as recited in claim 16 wherein the compressible conductors each comprise a curved conductor, wherein compression of the compressible conductors comprises deforming the curved conductor.

18. The apparatus as recited in claim 17 wherein there is a space between the curved conductor and the first surface, and wherein the apparatus comprises a compressible material inserted into the space.

19. The apparatus as recited in claim 16 wherein the component includes a power pad and a ground pad on each of the plurality of sides, and wherein the two or more connectors comprise connectors for less than a total number of the plurality of sides.

20. The apparatus as recited in claim 19 wherein the total number is four, and wherein connectors are provided for three of the plurality of sides.

21. A connector for use with a component that includes one or more integrated circuits and a component package to which the one or more integrated circuits are coupled, the component package having a bottom comprising a plurality of conductors for providing signal connection to the one or more integrated circuits, a top to which the one or more integrated circuits are coupled, and a plurality of sides, wherein at least one of the plurality of sides includes at least one power pad for providing a power supply voltage to the one or more integrated circuits and wherein at least one of the plurality of sides includes at least one ground pad for providing a ground to the one or more integrated circuits, the connector comprising:
 a conductive member having a first surface; and
 one or more compressible conductors affixed to the first surface, wherein the compressible conductors, during use, make electrical contact with the power pad and ground pad on the plurality of sides of the component package, wherein the compressible conductors each comprise a curved conductor, and wherein there is a space between the curved conductor and the first surface, and wherein the connector comprises a solid compressible material inserted into the space.

22. The connector as recited in claim 21 wherein the conductive member further comprises a second surface that is substantially perpendicular to the first surface.

23. The connector as recited in claim 22 wherein the conductive member comprises one or more holes in the second surface for receiving conductors.

24. The connector as recited in claim 22 further comprising one or more conductors extending from the second surface.

25. The connector as recited in claim 21 wherein compression of the compressible conductors comprises deforming the curved conductor.

26. An apparatus for use with a component that includes one or more integrated circuits and a component package to which the one or more integrated circuits are coupled, the component package having a bottom comprising a plurality of conductors for providing signal connection to the one or more integrated circuits, a top to which the one or more integrated circuits are coupled, and a plurality of sides, wherein at least one of the plurality of sides includes at least one power pad for providing a power supply voltage to the one or more integrated circuits and wherein at least one of the plurality of sides includes at least one ground pad for providing a ground to the one or more integrated circuits, the apparatus comprising:
 a pair of conductive plates, wherein a first plate of the pair comprises a first plurality of tabs, and wherein a second plate of the pair comprises a second plurality of tabs positioned differently than the first plurality of tabs on the first plate, and wherein the second plate further comprises a first plurality of slots that align to the first plurality of tabs when assembled;
 an insulator comprising a second plurality of slots aligned to the first plurality of slots when assembled, wherein the insulator is placed between the pair of conductive plates when assembled, and wherein the first plurality of tabs passes through the second plurality of slots and the first plurality of slots when assembled; and
 a plurality of connectors, wherein each of the plurality of connectors is connected to one of the pair of conductive plates and is configured to make electrical connection with one of the power pad or the ground pad on the plurality of sides of the component package.

27. The apparatus as recited in claim 26 further comprising a circuit board configured to be placed over a top of the component during use, wherein the circuit board is attached to the first plurality of tabs and the second plurality of tabs to supply the power supply voltage and the ground to the component.

28. The apparatus as recited in claim 27 wherein the circuit board is configured to supply the power supply voltage on the first plurality of tabs and the ground on the second plurality of tabs.

* * * * *